United States Patent
Lee et al.

(10) Patent No.: US 7,323,369 B2
(45) Date of Patent: Jan. 29, 2008

(54) FABRICATION METHOD FOR THIN FILM TRANSISTOR ARRAY SUBSTRATE

(75) Inventors: Chia-Tsung Lee, Hsinchu (TW);
Yu-Rung Huang, Hsinchu (TW);
Li-Chung Chang, Hsinchu (TW);
Chia-Hui Chueh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 11/616,002

(22) Filed: Dec. 25, 2006

(65) Prior Publication Data
US 2007/0166893 A1    Jul. 19, 2007

(30) Foreign Application Priority Data
Dec. 30, 2005  (TW) .............................. 94147546 A
Sep. 29, 2006  (TW) .............................. 95136203 A

(51) Int. Cl.
*H01L 21/84*   (2006.01)
*H01L 21/00*   (2006.01)

(52) U.S. Cl. ...................... 438/149; 438/151; 438/161; 257/57; 257/59; 257/E21.703; 257/E21.414; 257/E21.151

(58) Field of Classification Search ................ 438/149, 438/151, 161; 257/57, 59, E21.703, E21.151, 257/E21.414
See application file for complete search history.

(56) References Cited
U.S. PATENT DOCUMENTS

| | | | |
|---|---|---|---|
| 6,716,660 B2* | 4/2004 | Jeong et al. | .................. 438/48 |
| 2005/0242401 A1* | 11/2005 | Cho et al. | .................. 257/368 |
| 2006/0145157 A1* | 7/2006 | Choi et al. | .................... 257/66 |

* cited by examiner

*Primary Examiner*—Scott B. Geyer
*Assistant Examiner*—Mohsen Ahmadi
(74) *Attorney, Agent, or Firm*—Jianq Chyun IP Office

(57) ABSTRACT

Scan lines are formed on a substrate. A patterned dielectric layer and a patterned semiconductor layer are formed to cover portions of the scan lines. A patterned transparent conductive layer and a patterned metal layer are sequentially formed to define data lines, source/drain electrodes, pixel electrodes and etching protecting layers. The etching protective layers cover the exposed scan lines exposed by the patterned dielectric layer and the patterned semiconductor layer, and are electrically connected to the scan lines. A passivation layer is formed, and then the passivation layer over the pixel electrodes and the patterned metal layer of the pixel electrodes are removed to expose the patterned transparent conductive layer. The patterned semiconductor layer over the scan lines between the etching protective layers and the data lines is removed to expose the patterned dielectric layer over the scan lines.

28 Claims, 43 Drawing Sheets

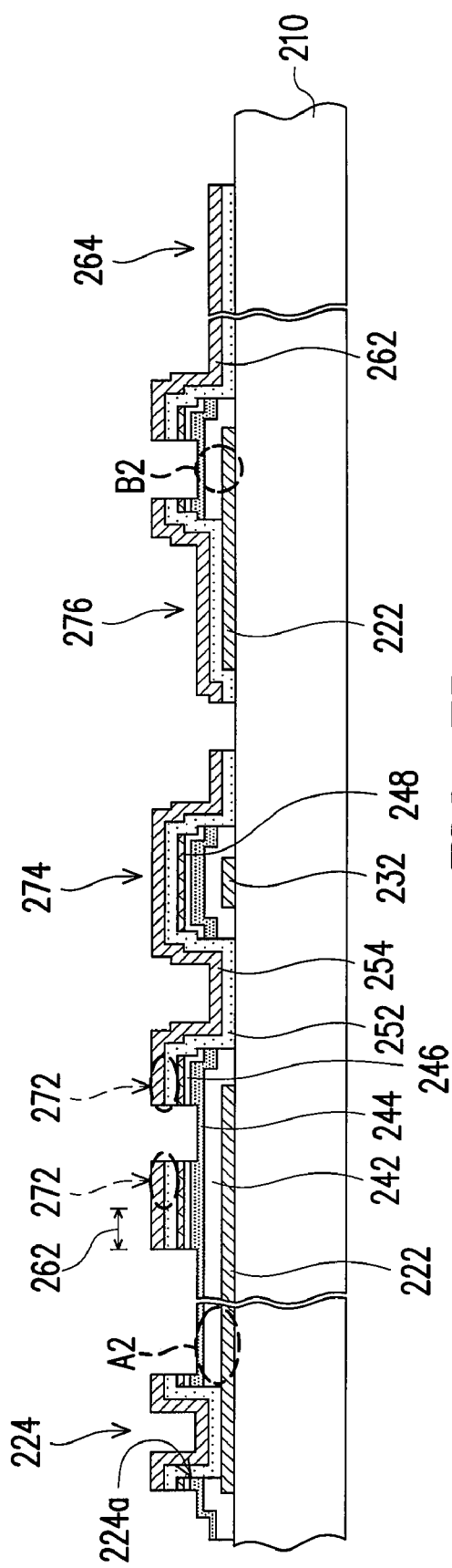
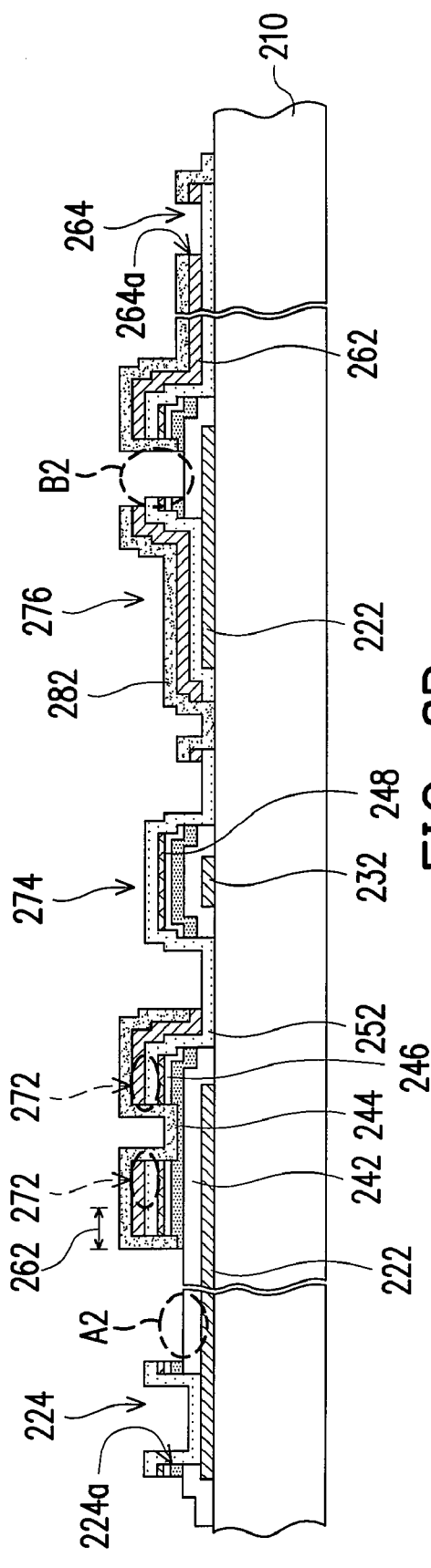

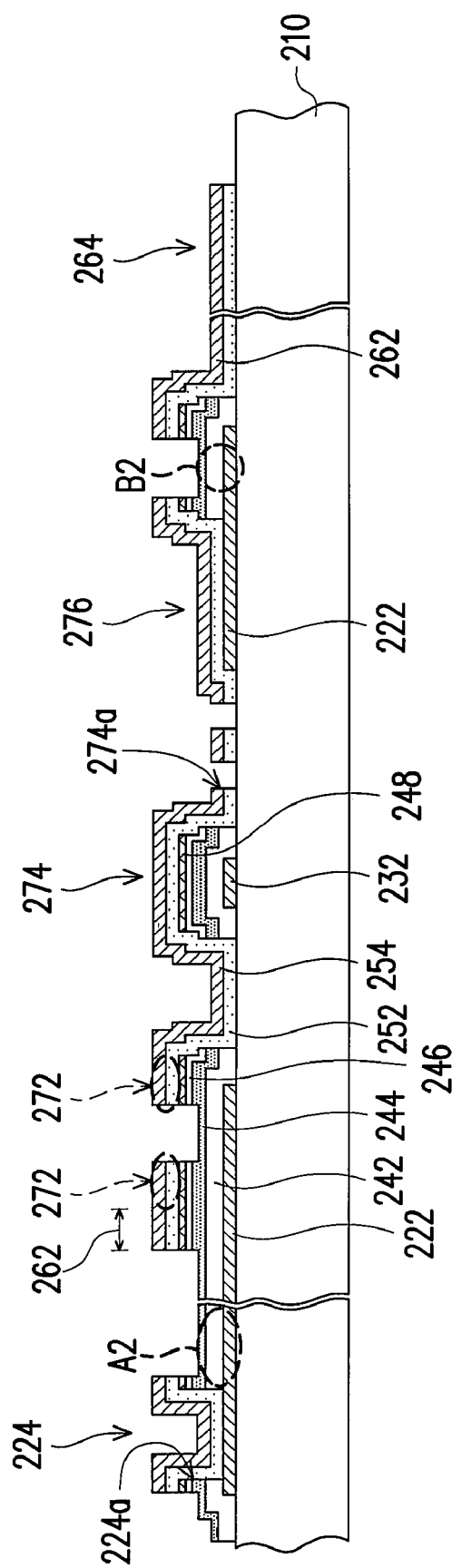
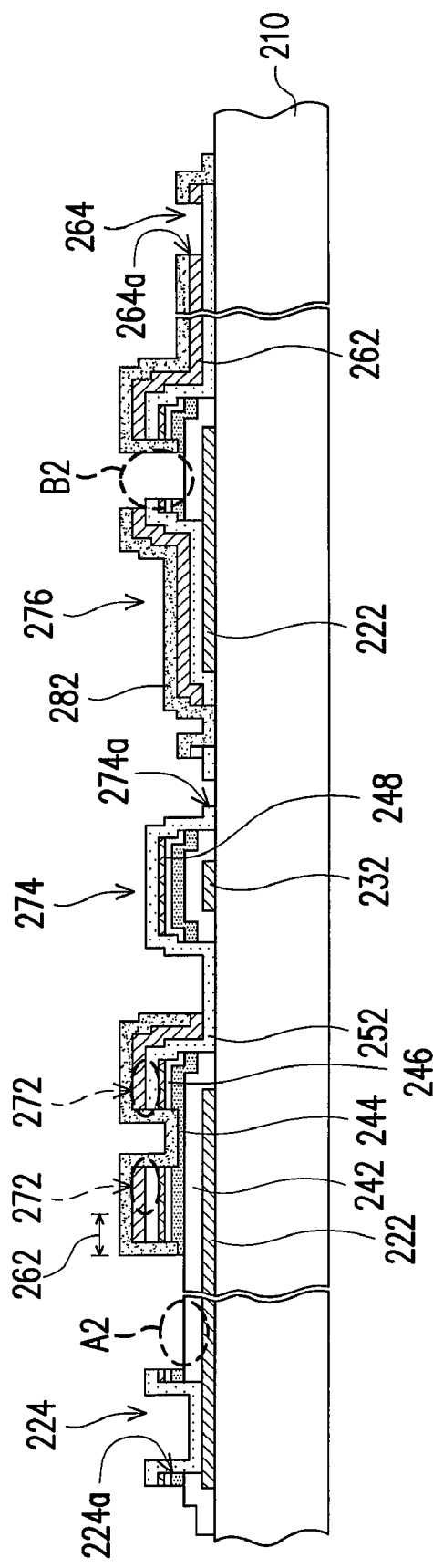

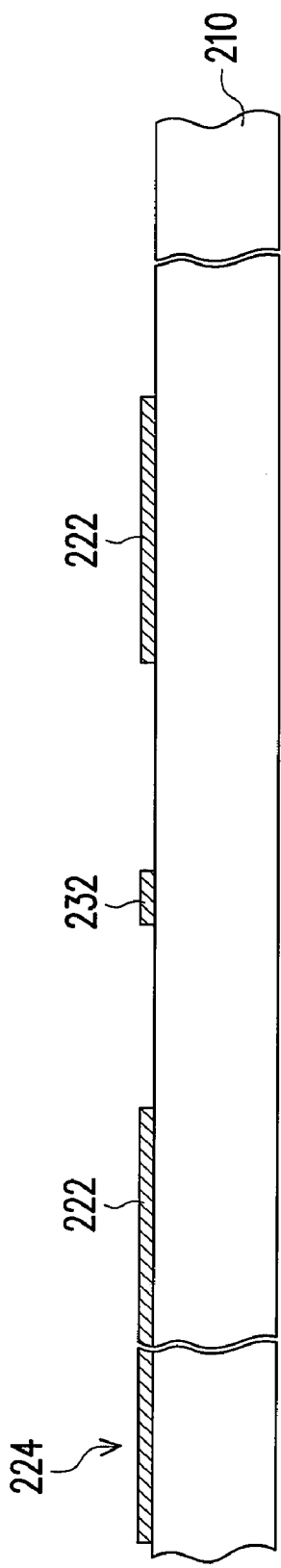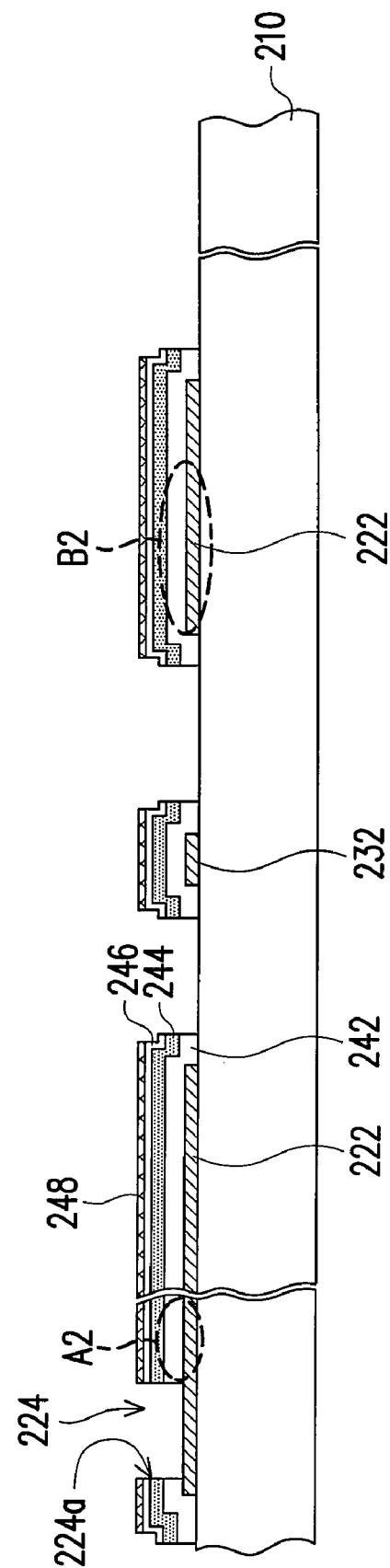

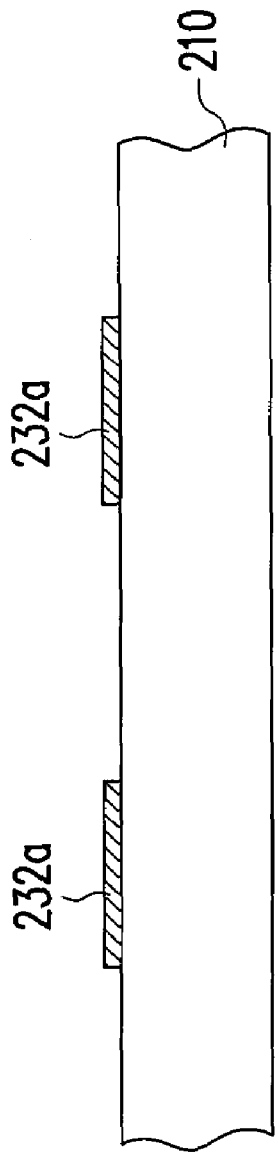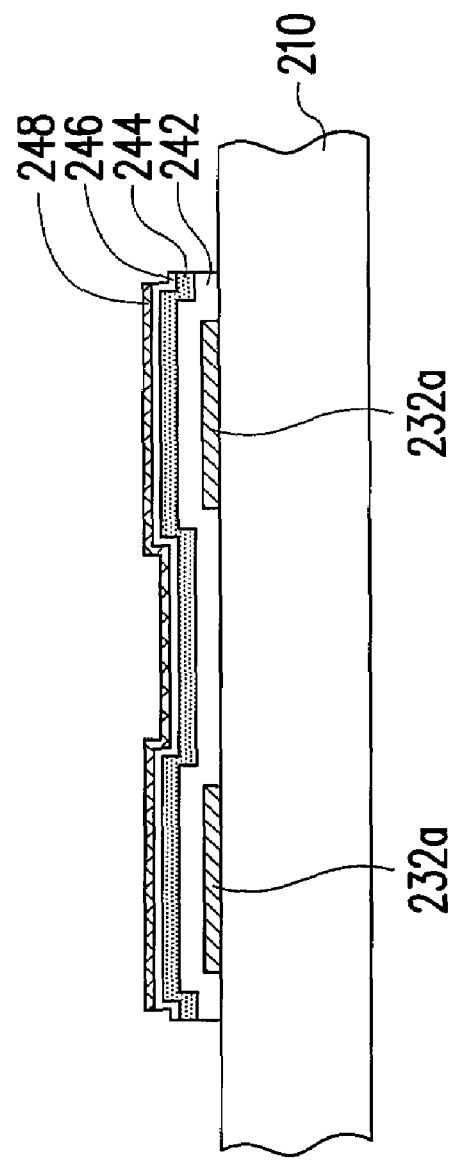

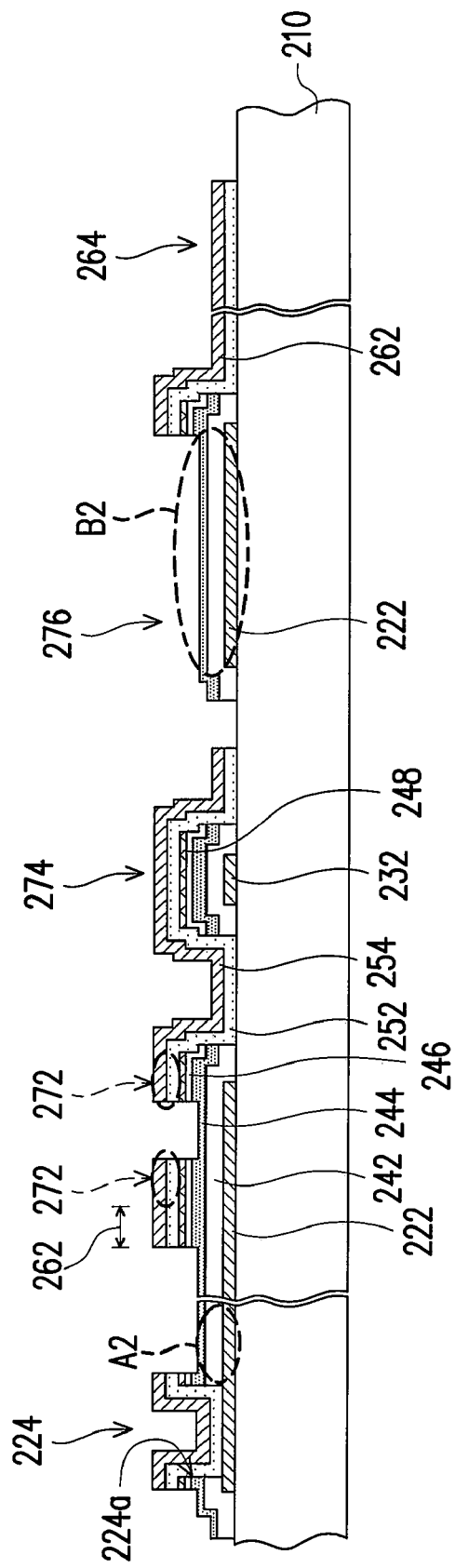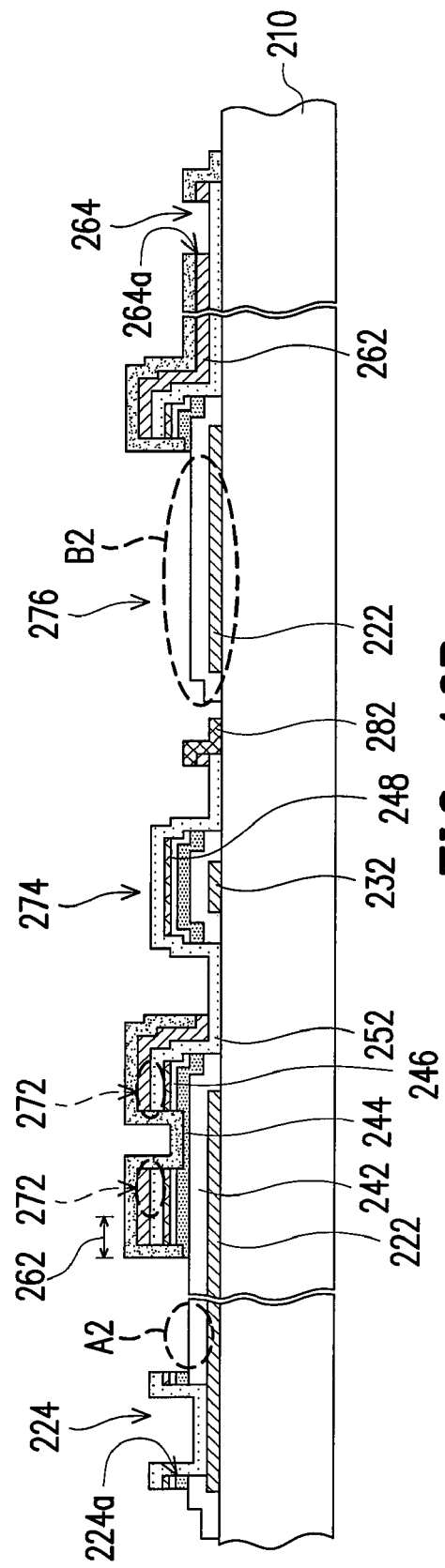

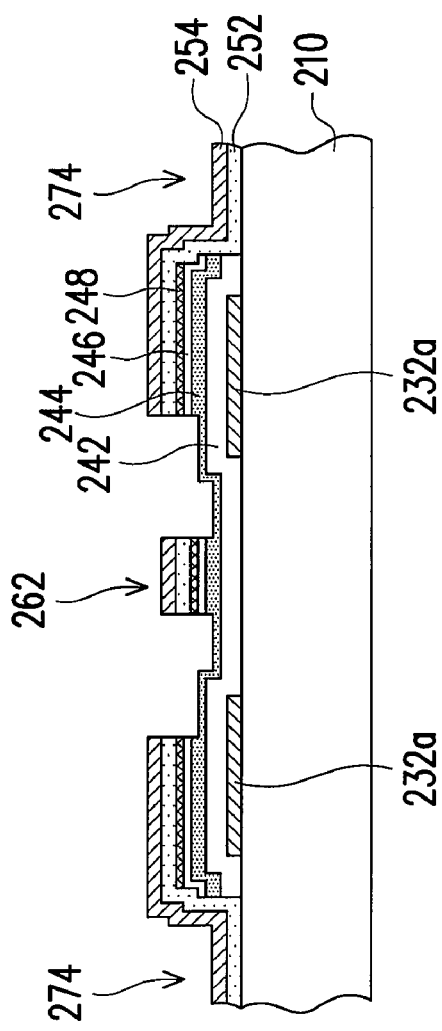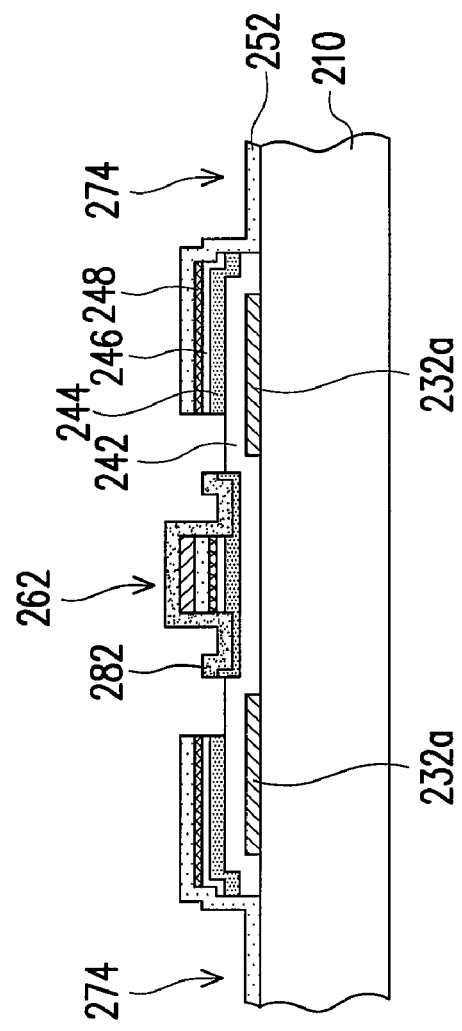

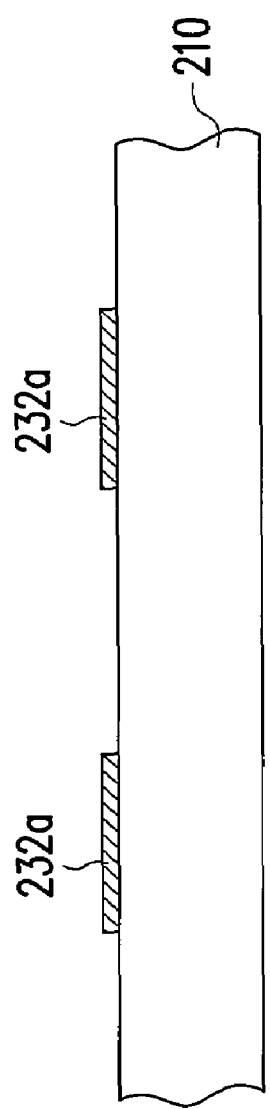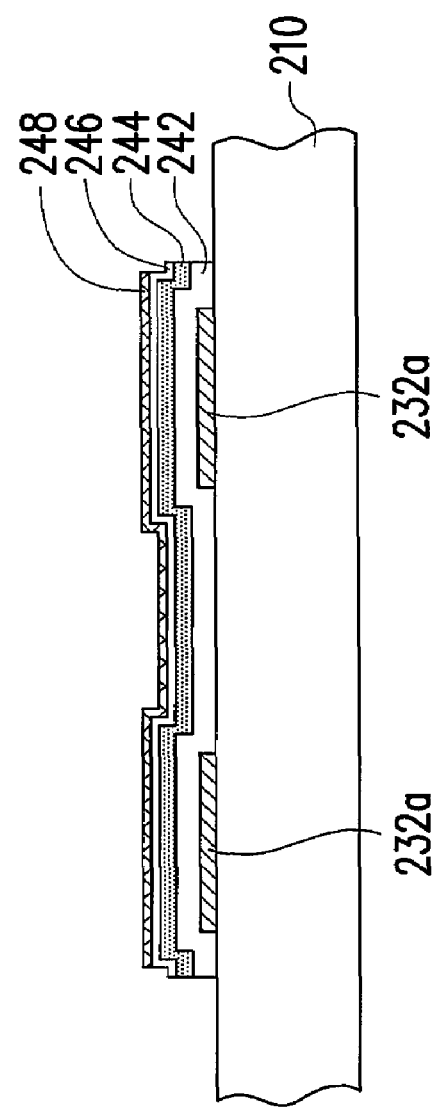

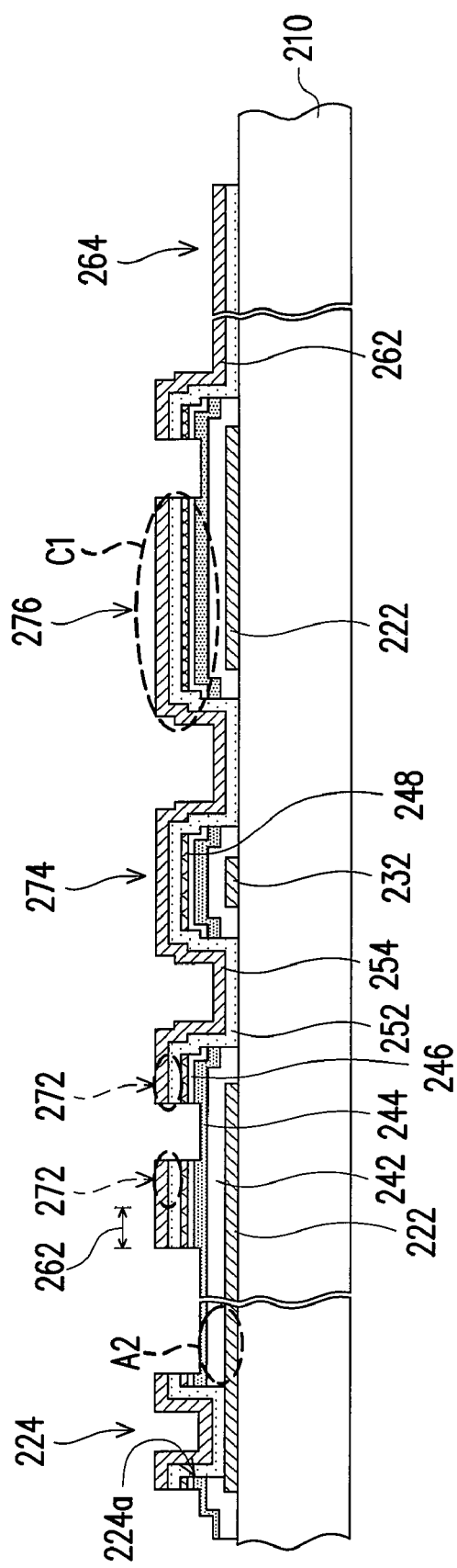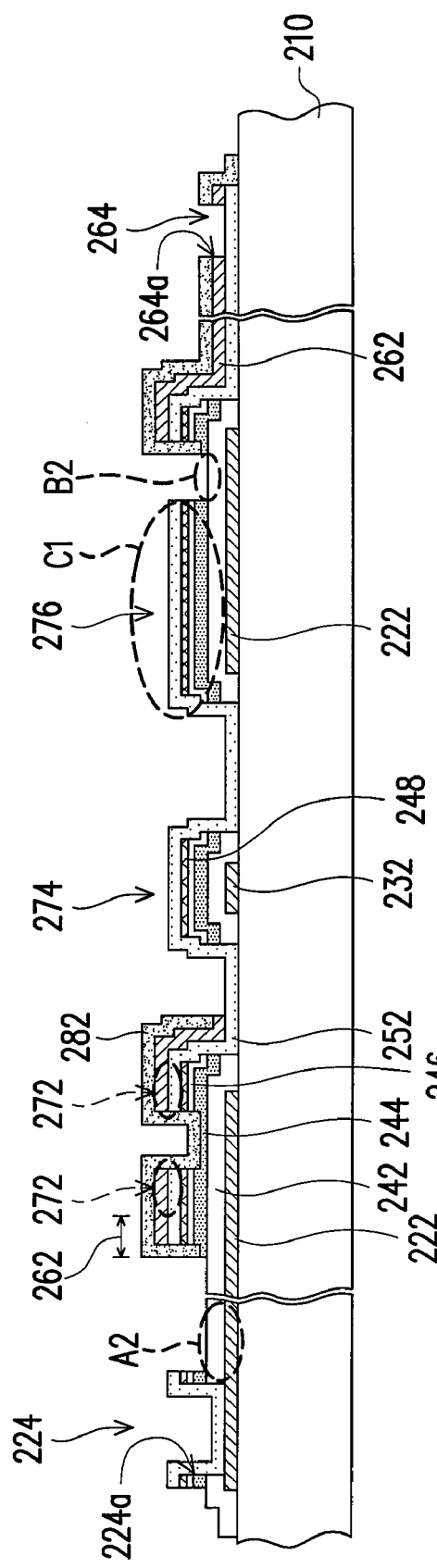
FIG. 19B
FIG. 20B

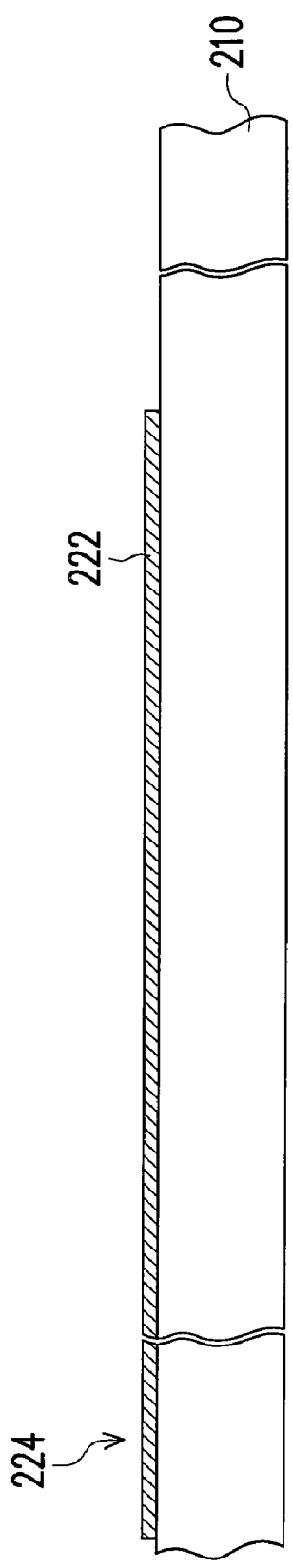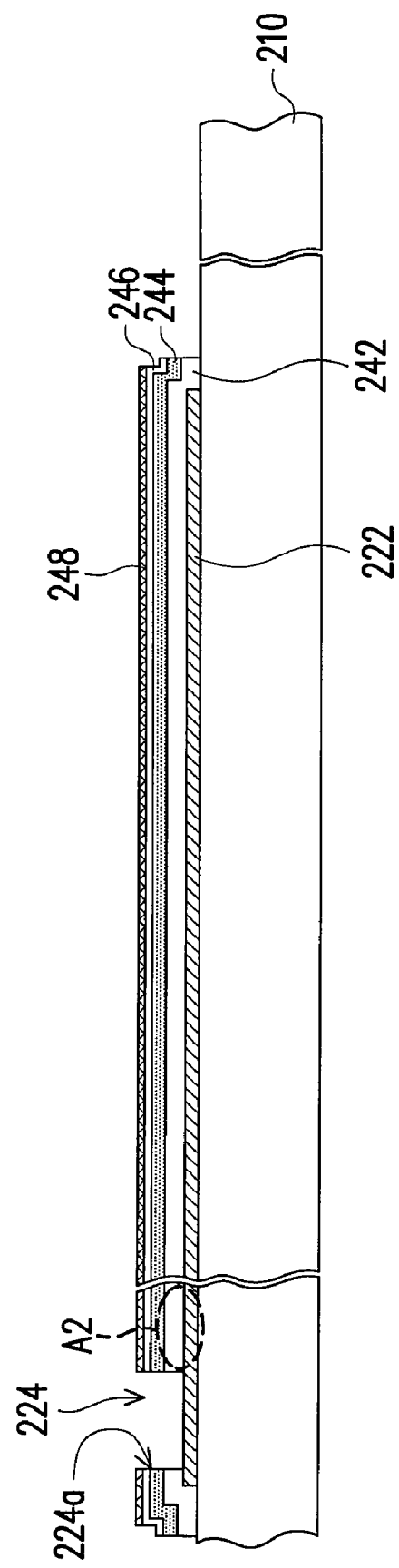

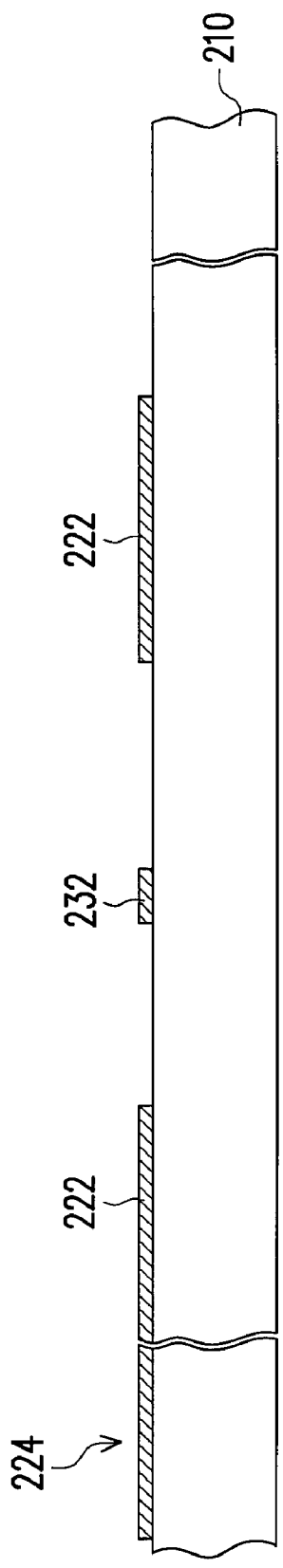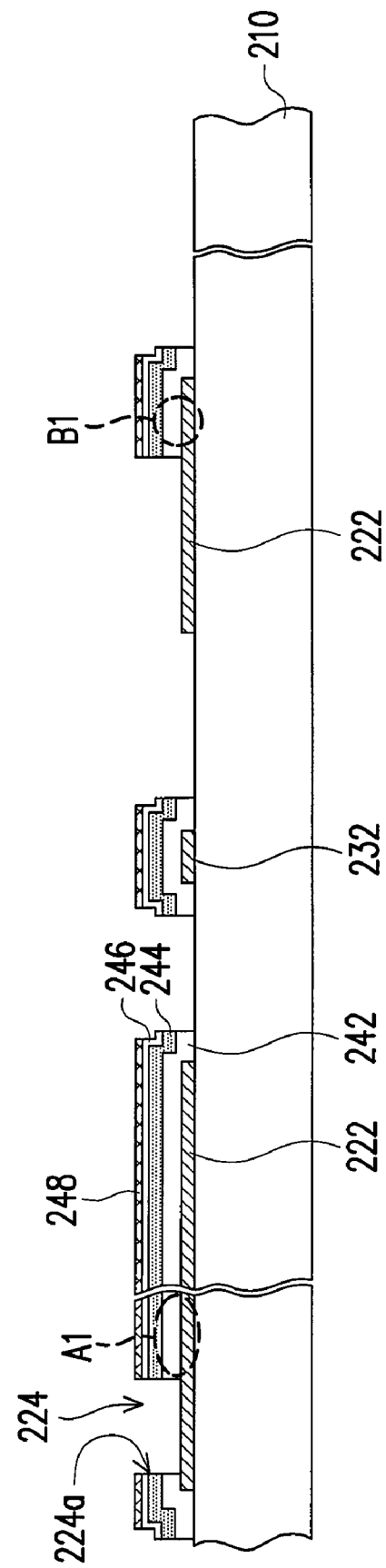
FIG. 25B
FIG. 26B

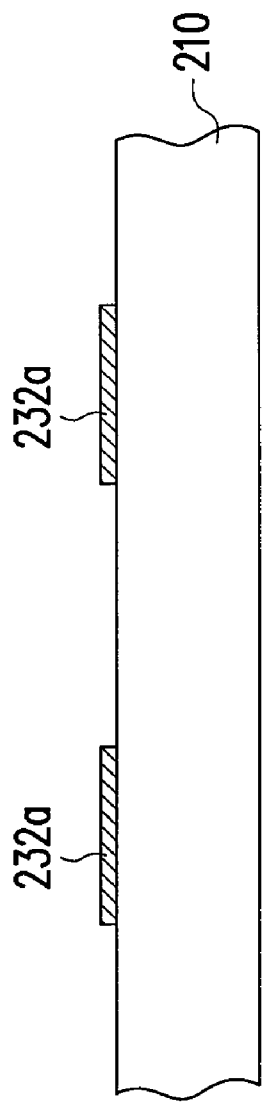
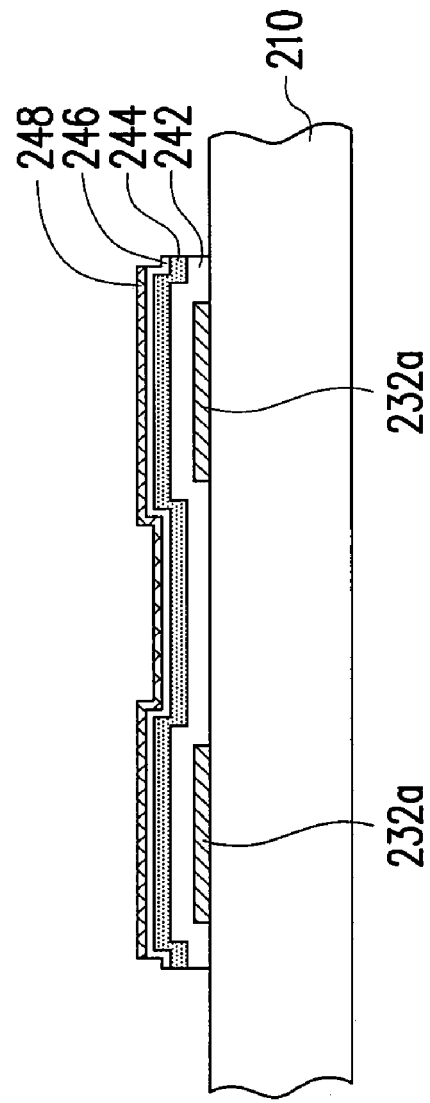

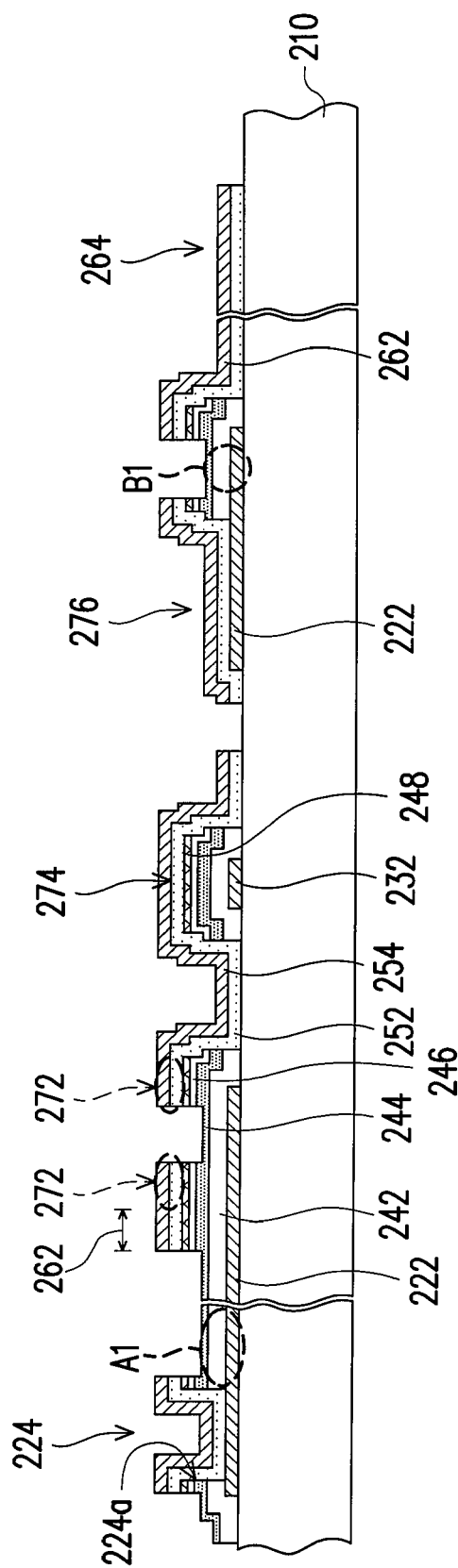
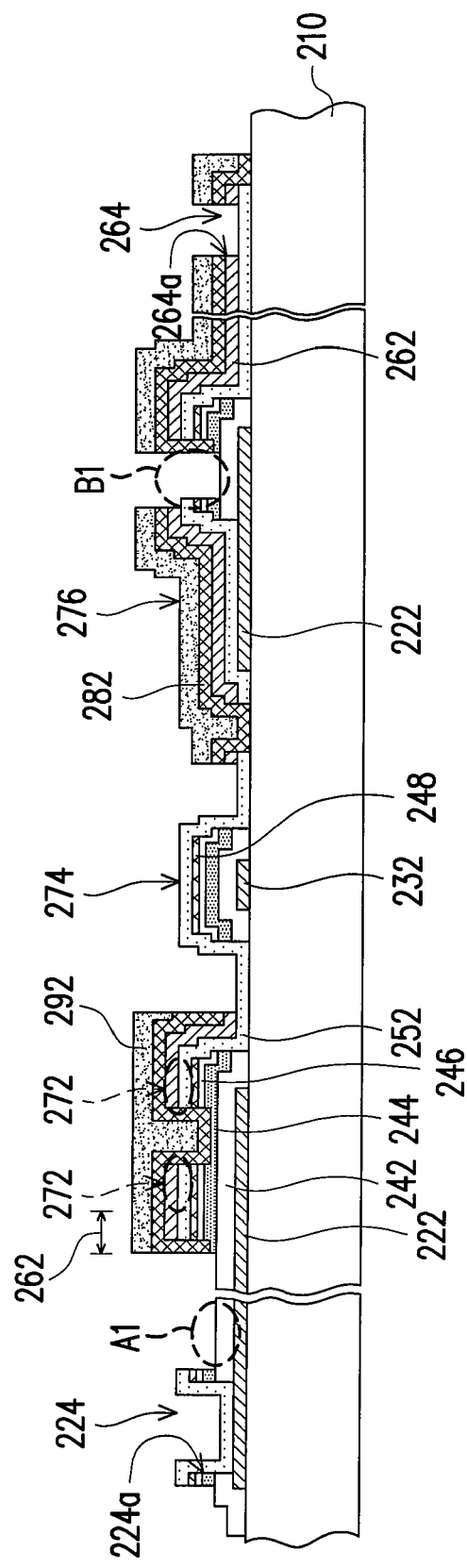

FABRICATION METHOD FOR THIN FILM TRANSISTOR ARRAY SUBSTRATE

CROSS-REFERENCE TO RELATED APPLICATION

This application claims the priority benefits of Taiwan application serial no. 94147546, filed on Dec. 30, 2005 and Taiwan application serial no. 95136203 filed on Sep. 29, 2006. All disclosures of the Taiwan applications are incorporated herein by reference.

BACKGROUND OF THE INVENTION

1. Field of Invention

The present invention relates to a fabrication method for an active element array substrate, and more particularly, to a fabrication method for a thin film transistor array substrate.

2. Description of Related Art

The demands and researches on display apparatus are increasing. The CRT (cathode ray tube) display is a mainstream in the display apparatus due to its great display quality. However, the tendency on the display apparatus directs to light, compact, low power consumption and low radiation but the CRT displays do not meet the requirements. Therefore, the TFT-LCD (Thin Film Transistor Liquid Crystal Display) displays play an important role now.

A TFT-LCD display is formed by a LCD panel and a backlight module. The LCD panel is formed by a TFT array substrate, a color filter substrate and liquid crystal layers sandwiched therebetween. The backlight module provides light sources for the LCD panel for display.

FIGS. 1A~4A show top views of a conventional TFT array substrate and FIGS. 1B~4B show cross-sectional views taken along the line I-I' in FIGS. 1A~4A.

Please refer to FIGS. 1A and 1B. A first metal layer having a thickness with several thousand angstroms is formed on a substrate 110 by sputtering process. A first mask process is performed on the first metal layer for forming scan lines 122, scan pads 124, common lines 132 and common pads 134. One end of each of the scan lines 122 is electrically connected to one of the scan pads 124 and one end of each of the common lines 132 is electrically connected to one of the common pads 134.

Please refer to FIGS. 2A and 2B. A dielectric layer, a semiconductor layer and an ohmic contact layer are sequentially formed over the substrate 110. The dielectric layer, the semiconductor layer and the ohmic contact layer are made of SiNx, a-Si (amorphous silicon) and $n^+$-Si, respectively. A contact metal layer is formed over the ohmic contact layer by sputtering. A second mask process is performed on the resulting structure for sequentially forming a patterned dielectric layer 142, a patterned semiconductor layer 144, a patterned ohmic contact layer 146 and a patterned contact metal layer 148. For improving the yield, the patterned dielectric layer 142, the patterned semiconductor layer 144, the patterned ohmic contact layer 146 and the patterned contact metal layer 148 cover the common lines 132 and portions of the scan lines 122. In other words, the resulting structure is completed-etched or over-etched for removing the patterned dielectric layer 142, the patterned semiconductor layer 144, the patterned ohmic contact layer 146 and the patterned contact metal layer 148 in other regions. So, the exposed common pads 134, the scan pads 124 and the portions of the scan lines may be slighted damaged (etched), for example those in regions A1 and B1 of FIG. 2B. Wirings in the region A1 are exposed and portions of the scan lines are exposed in the region B1.

Please refer to FIGS. 3A and 3B. A transparent conductive layer and a second metal layer are sequentially disposed over the substrate 110. Then, a third mask process is performed for forming a patterned transparent conductive layer 152 and a patterned second metal layer 154. The patterned transparent conductive layer 152 and the patterned second metal layer 154 are defined to form data lines 162, data pads 164, source/drain electrodes 172 and pixel electrodes 174. One of each of the data lines 162 is electrically connected to one of the data pads 164. In channel etching, because portions of scan lines 122 are exposed (for example, in the region A1 and B1), the portions of the scan lines 122 have a reduced thickness and accordingly the resistance thereof is higher or they may be broken. The yield is negatively affected.

Please refer to FIGS. 4A and 4B. A passivation layer 182 is formed over the substrate 110. The passivation layer 182 is made of SiNx. A fourth mask process is performed for forming first openings 124a, second openings 164a and third openings 134a. The patterned transparent conductive layer 152 over the scan pad 124 is exposed by the first opening 124a. The patterned transparent conductive layer 152 over the data pads 164 is exposed by the second openings 164a. The patterned transparent conductive layer 152 over the common pads 134 is exposed by the third openings 134a. The patterned second metal layer 154 of the pixel electrodes 174 is totally removed for exposing the patterned transparent conductive layer 152 of the pixel electrodes 174. By the above, the conventional TFT array substrate is almost made.

Because of the four-round mask processes and for improving the yield, the patterned dielectric layer 142, the patterned semiconductor layer 144, the patterned ohmic contact layer 146 and the patterned contact metal layer 148 outside predetermined regions have to be totally removed. The exposed common pads 134 and the portions of the scan lines 122 (for example, in the regions A1 and B1 of FIGS. 2A and 2B) may be slightly damaged. Besides, in the third mask process, the exposed scan lines 122 may be further damaged to reduce thickness thereof and may be broken. (for example, in the regions A1 and B1 of FIGS. 3A and 3B).

The distances between the pixel electrodes 174 and the data lines 164 are kept for preventing short therebetween. This reduces the aperture ratio.

SUMMARY OF THE INVENTION

The invention is to provide a fabrication method for a TFT array substrate for preventing the scan lines from being damaged.

The invention is to provide a fabrication method for a TFT array substrate for improving the aperture ratio.

The invention provides a fabrication method for a TFT array substrate. In the method, a plurality of scan lines is formed on a substrate. A patterned dielectric layer and a patterned semiconductor layer are sequentially formed over the substrate for covering portions of the scan lines. A patterned transparent conductive layer and a patterned metal layer are sequentially formed over the substrate. The patterned transparent conductive layer and the patterned metal layer are used for defining a plurality of data lines, a plurality of source/drain electrodes, a plurality of pixel electrodes and a plurality of etching protective layers. The etching protective layers cover and are electrically coupled to the scan lines exposed by the patterned dielectric layer and the patterned semiconductive layer. A passivation layer is formed over the substrate. The passivation layer over the pixel electrodes and the patterned metal layer of the pixel electrodes are removed for exposing the patterned transparent conductive layer of the pixel electrodes. The patterned semiconductive layer over the scan lines between the etching protective layers and the data lines is removed for exposing the patterned dielectric layer on the scan lines.

In one embodiment of the present invention, the step of forming the scan lines includes forming a plurality of scan pads, one end of each of the scan lines being electrically connected to one of the scan pads. Portions of the scan pads are exposed by the patterned dielectric layer and the patterned semiconductor layer after formation of the patterned dielectric layer and the patterned semiconductor layer.

In one embodiment of the present invention, the patterned transparent conductive layer and the patterned metal layer cover the scan pads exposed by the patterned dielectric layer and the patterned semiconductor layer.

In one embodiment of the present invention, the step of removing the passivation layer over the pixel electrodes includes removing the patterned metal layer over the scan pads for exposing the patterned transparent conductive layer over the scan pads.

In one embodiment of the present invention, in the step of forming the data lines, the patterned transparent conductive layer and the patterned metal layer are used to define a plurality of data pads, one end of each of the data lines electrically connected to one of the data pads.

In one embodiment of the present invention, in the step of forming the passivation layer, the passivation layer covers the data pads. The step of removing the passivation layer over the pixel electrodes includes removing the patterned metal layer over the data pads for exposing the patterned transparent conductive layer over the data pads.

In one embodiment of the present invention, the step of forming the scan lines further includes forming a plurality of common pads and a plurality of common lines electrically connected to the common pads, the common lines being parallel to the scan lines respectively, and the common lines and the scan lines being alternately disposed over the substrate.

In one embodiment of the present invention, each of the common lines includes a plurality of branches extending from the sides thereof, and the patterned transparent conductive layer of the pixel electrodes are partially overlapped with the branches.

In one embodiment of the present invention, the step of forming the patterned transparent conductive layer and the patterned metal layer includes forming a plurality of slits insides the pixel electrodes.

In one embodiment of the present invention, the step of forming the patterned dielectric layer and the patterned semiconductive layer includes forming a patterned ohmic contact layer over the patterned semiconductive layer.

In one embodiment of the present invention, the step of forming the patterned dielectric layer and the patterned semiconductive layer further includes forming a patterned contact metal layer over the patterned ohmic contact layer.

In one embodiment of the present invention, each of the scan lines includes a plurality of gate regions.

In one embodiment of the present invention, the step of forming the scan lines further includes forming a plurality of gates electrically connected to the scan lines respectively.

In one embodiment of the present invention, after the passivation layer is formed and before a portion of the passivation layer is removed, an opaque material layer is formed thereon. The opaque material layer is then patterned to form a opaque layer.

The invention provides another fabrication method for a TFT array substrate. In the method, a plurality of scan lines is formed on a substrate. A patterned dielectric layer and a patterned semiconductor layer are sequentially formed over the substrate for covering the scan lines. A patterned transparent conductive layer and a patterned metal layer are sequentially formed over the substrate. The patterned transparent conductive layer and the patterned metal layer are used for defining a plurality of data lines, a plurality of source/drain electrodes and a plurality of pixel electrodes. A portion of the patterned semiconductor layer over the scan lines is exposed by the patterned transparent conductive layer and the patterned metal layer. A passivation layer is formed over the substrate. The passivation layer over the pixel electrodes and the patterned metal layer of the pixel electrodes are removed for exposing the patterned transparent conductive layer of the pixel electrodes, and the portion of the patterned semiconductor layer over the scan lines exposed by the patterned transparent conductive layer and the patterned metal layer is removed for exposing the patterned dielectric layer over the scan lines.

In one embodiment of the present invention, the step of forming the scan lines includes forming a plurality of scan pads, one end of each of the scan lines electrically connected to one of the scan pads. Portions of the scan pads are exposed by the patterned dielectric layer and the patterned semiconductive layer after formation of the patterned dielectric layer and the patterned semiconductive layer.

In one embodiment of the present invention, the patterned transparent conductive layer and the patterned metal layer cover the scan pads exposed by the patterned dielectric layer and the patterned semiconductor layer.

In one embodiment of the present invention, the step of removing the passivation layer over the pixel electrodes includes removing the patterned metal layer over the scan pads for exposing the patterned transparent conductive layer over the scan pads.

In one embodiment of the present invention, in the step of forming the data lines, the patterned transparent conductive layer and the patterned metal layer are used to define a plurality of data pads, one end of each of the data lines electrically connected to one of the data pads.

In one embodiment of the present invention, in the step of forming the passivation layer, the passivation layer covers the data pads. The step of removing the passivation layer over the pixel electrodes includes removing the patterned metal layer over the data pads for exposing the patterned transparent conductive layer over the data pads.

In one embodiment of the present invention, the step of forming the scan lines includes forming a plurality of common pads and a plurality of common lines electrically connected to the common pads respectively, the common lines being parallel to the scan lines, and the common lines and the scan lines being alternately disposed over the substrate.

In one embodiment of the present invention, each of the common lines includes a plurality of branches extending from the sides thereof, and the patterned transparent conductive layer of the pixel electrodes are partially overlapped with the branches.

In one embodiment of the present invention, in the step of forming the patterned transparent conductive layer and the patterned metal layer, the pixel electrodes cover portions of the scan lines.

In one embodiment of the present invention, the step of forming the patterned dielectric layer and the patterned semiconductive layer includes forming a patterned ohmic contact layer over the patterned semiconductive layer.

In one embodiment of the present invention, the step of forming the patterned dielectric layer and the patterned semiconductive layer further includes forming a patterned contact metal layer over the patterned ohmic contact layer.

In one embodiment of the present invention, each of the scan lines includes a plurality of gate regions.

In one embodiment of the present invention, the step of forming the scan lines includes forming a plurality of gates electrically connected to the scan lines respectively.

In one embodiment of the present invention, after the passivation layer is formed and before a portion of the passivation layer is removed, an opaque material layer is formed thereon. The opaque material layer is then patterned to form an opaque layer.

In the invention, the semiconductor, the ohmic contact layer or the metal layer forming the data lines, or combination thereof are used for protecting the exposed scan lines. Therefore, the damage to the scan line is reduced. The common line with the branches is applicable in the invention as the shield layer for the sides of the TFT array substrate for increasing the aperture ratio. On the other hand, a patterning process is performed on the opaque material layer, the passivation layer, and the patterned metal layer to expose the patterned transparent conductive layer of the pixel electrodes and to form the opaque layer which is not removed in the successive processes. Therefore, the TFT array substrate provided by the present invention can be used with the color filter substrate having no opaque layer, so that the aperture ratio is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A~4A show top views of a conventional TFT array substrate.

FIGS. 1B~4B show cross-sectional views taken along the line I-I' in FIGS. 1A~4A.

FIGS. 5A~8A show top views of a TFT array substrate according to a first embodiment of the invention.

FIGS. 5B~8B show cross-sectional views taken along the line II-II' in FIGS. 5A~8A.

FIGS. 5C~8C show cross-sectional views taken along the line III-III' in FIGS. 5A~8A.

FIGS. 9A~12A show top views of a TFT array substrate according to a second embodiment of the invention.

FIGS. 9B~12B show cross-sectional views taken along the line II-II' in FIGS. 9A~12A.

FIGS. 13A~16A show top views of a TFT array substrate according to a third embodiment of the invention.

FIGS. 13B~16B show cross-sectional views taken along the line II-II' in FIGS. 13A~16A.

FIGS. 13C~16C show cross-sectional views taken along the line III-III' in FIGS. 13A~16A.

FIGS. 17A~20A show top views of a TFT array substrate according to a fourth embodiment of the invention.

FIGS. 17B~20B show cross-sectional views taken along the line II-II' in FIGS. 17A~20A.

FIGS. 17C~20C show cross-sectional views taken along the line III-III' in FIGS. 17A~20A.

FIGS. 21A~24A show top views of a TFT array substrate according to a fifth embodiment of the invention.

FIGS. 21B~24B show cross-sectional views taken along the line II-II' in FIGS. 21A~24A.

FIGS. 25A~28A are top views of a TFT array substrate according to a sixth embodiment of the invention.

FIGS. 25B~28B illustrate cross-sectional views taken along the line II-II' in FIGS. 25A~28A.

FIGS. 25C~28C illustrate cross-sectional views taken along the line III-III' in FIGS. 25A~28A.

DESCRIPTION OF THE EMBODIMENTS

Figure 1A:
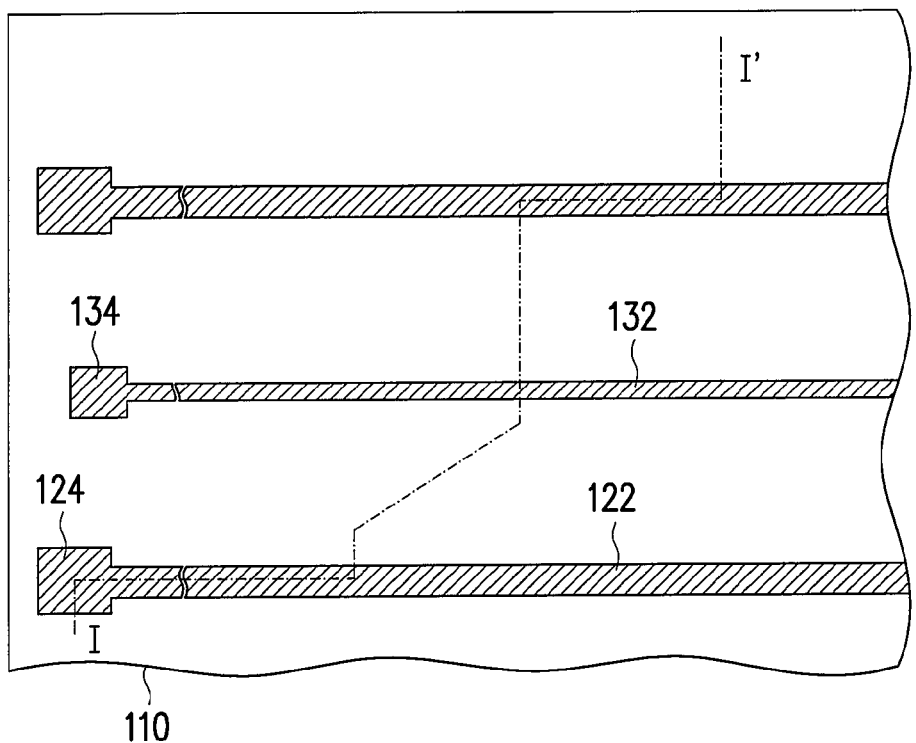
Figure 2A:
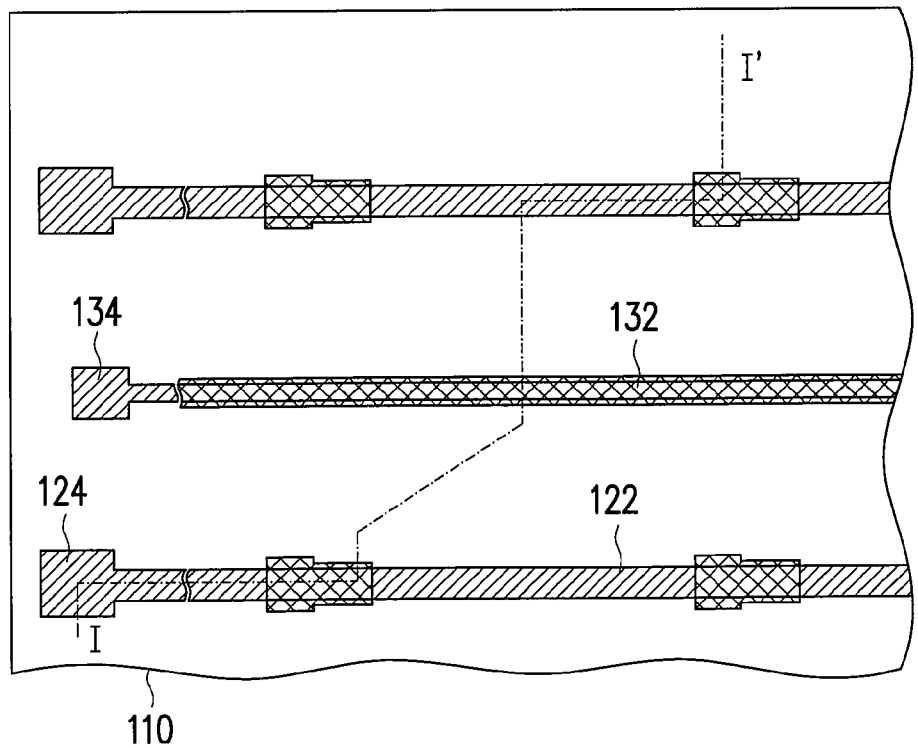
Figure 1B:
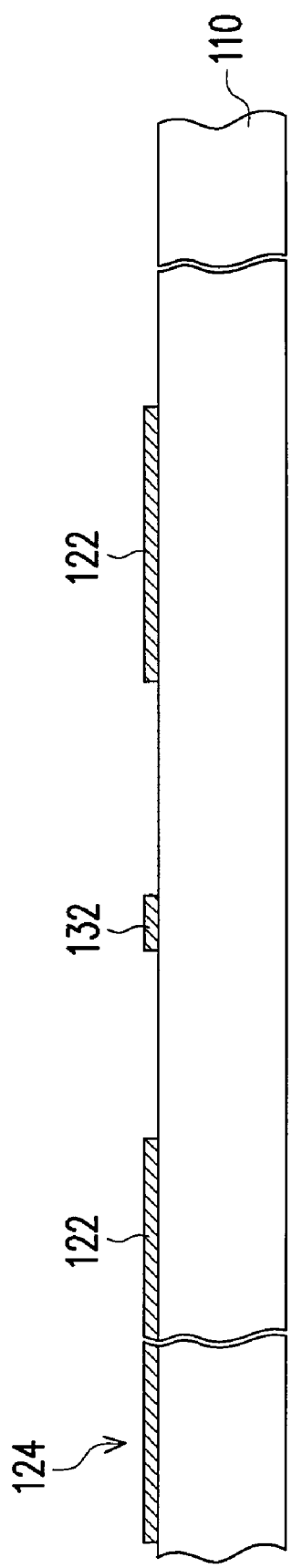
Figure 2B:
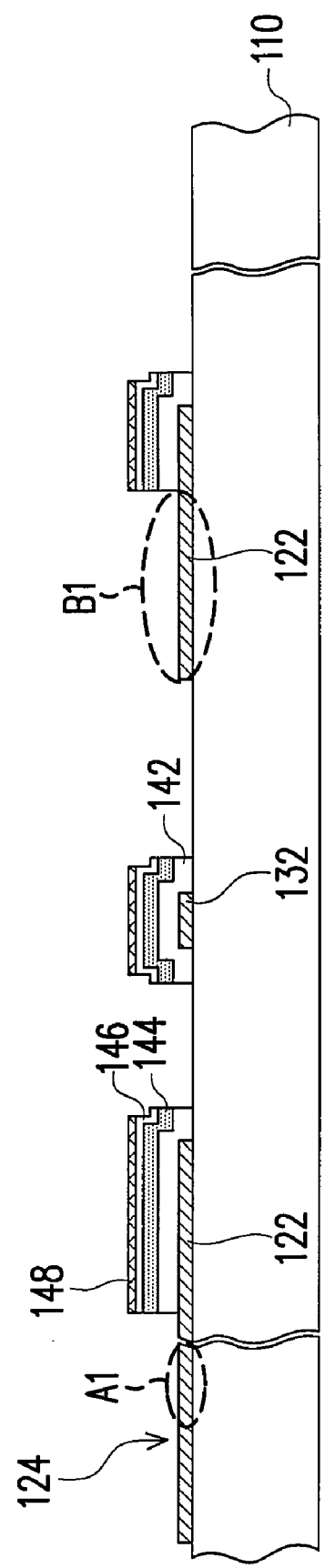
Figure 3A:
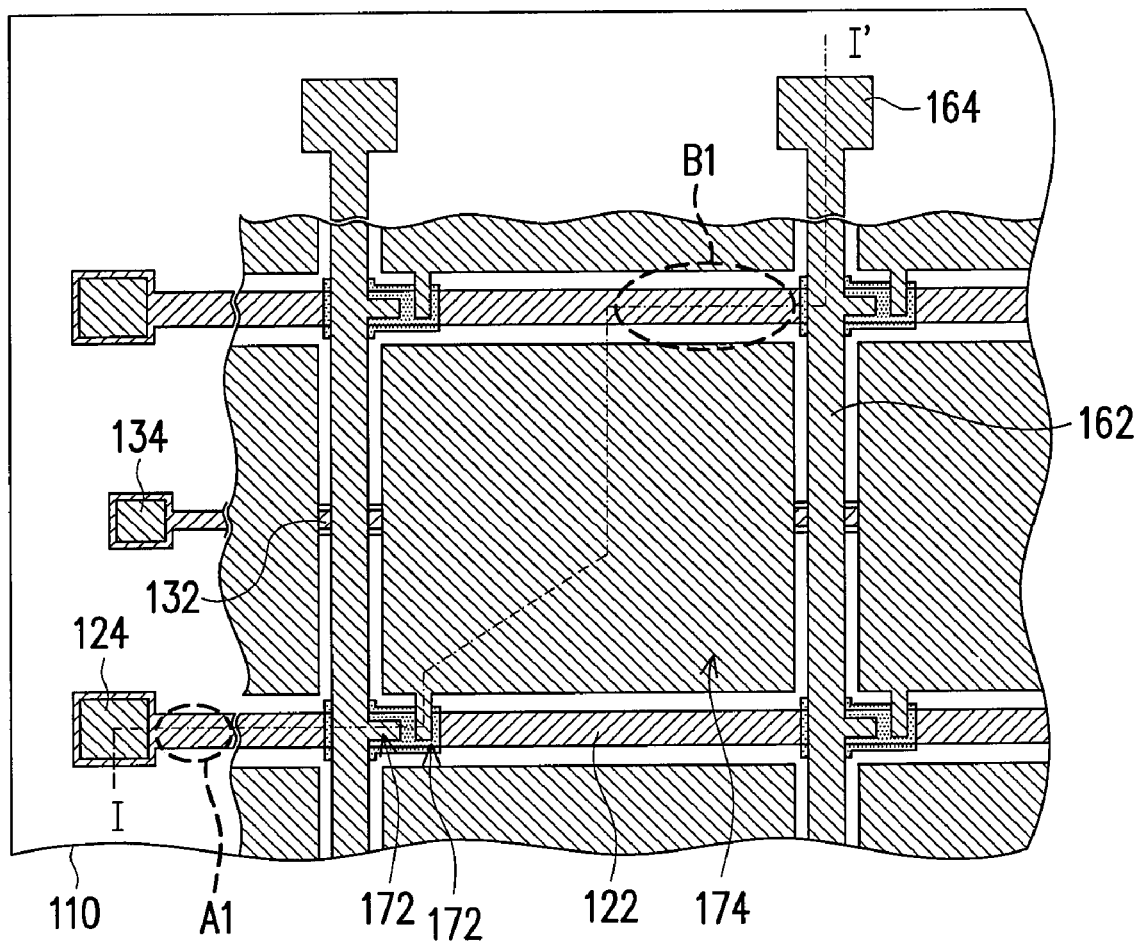
Figure 3B:
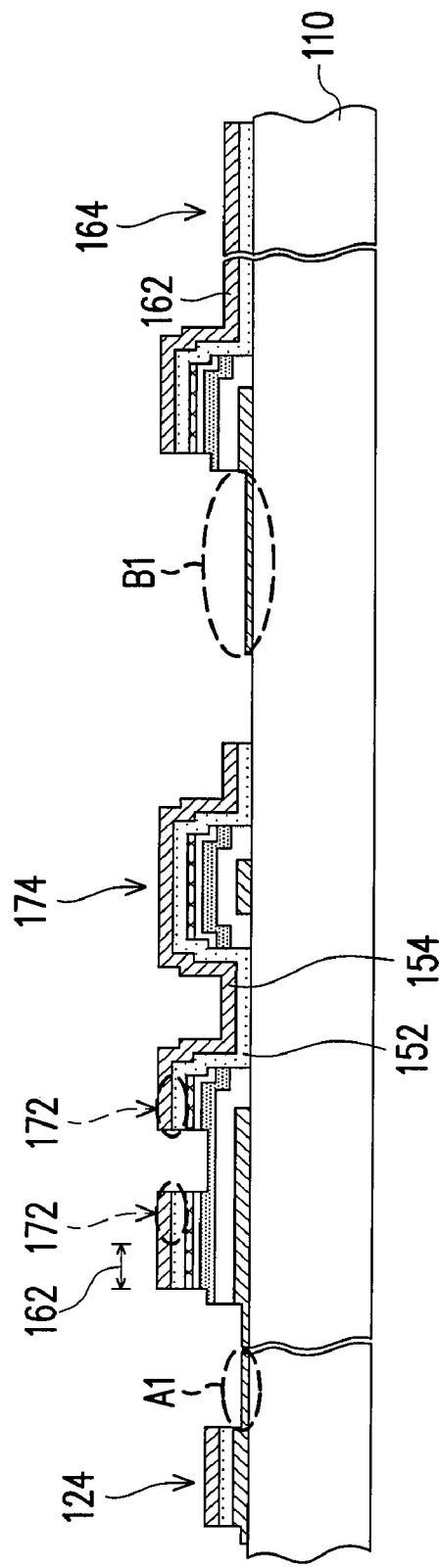
Figure 4B:
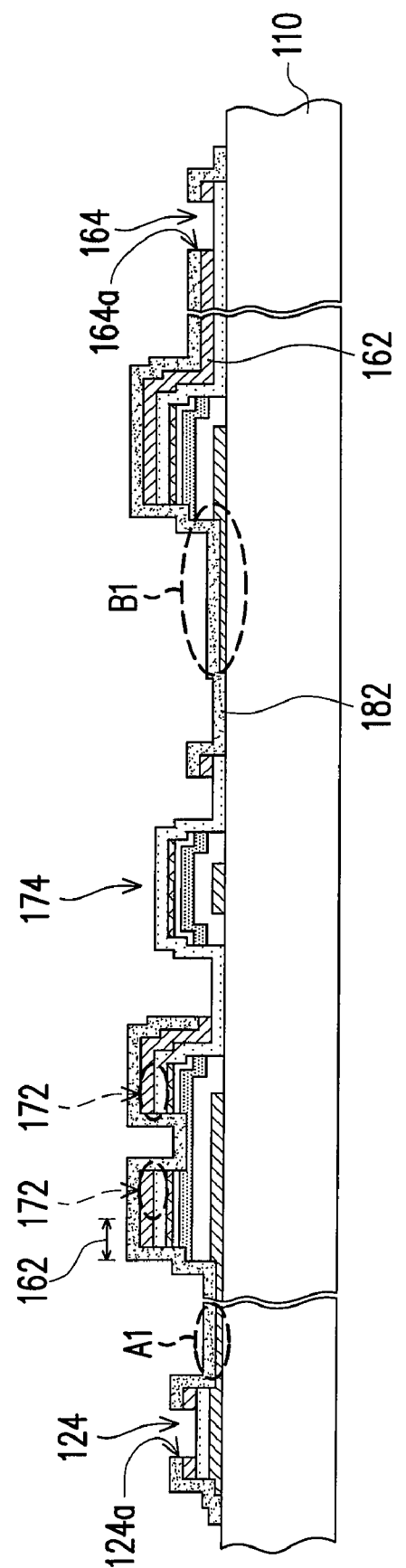
Figure 4A:
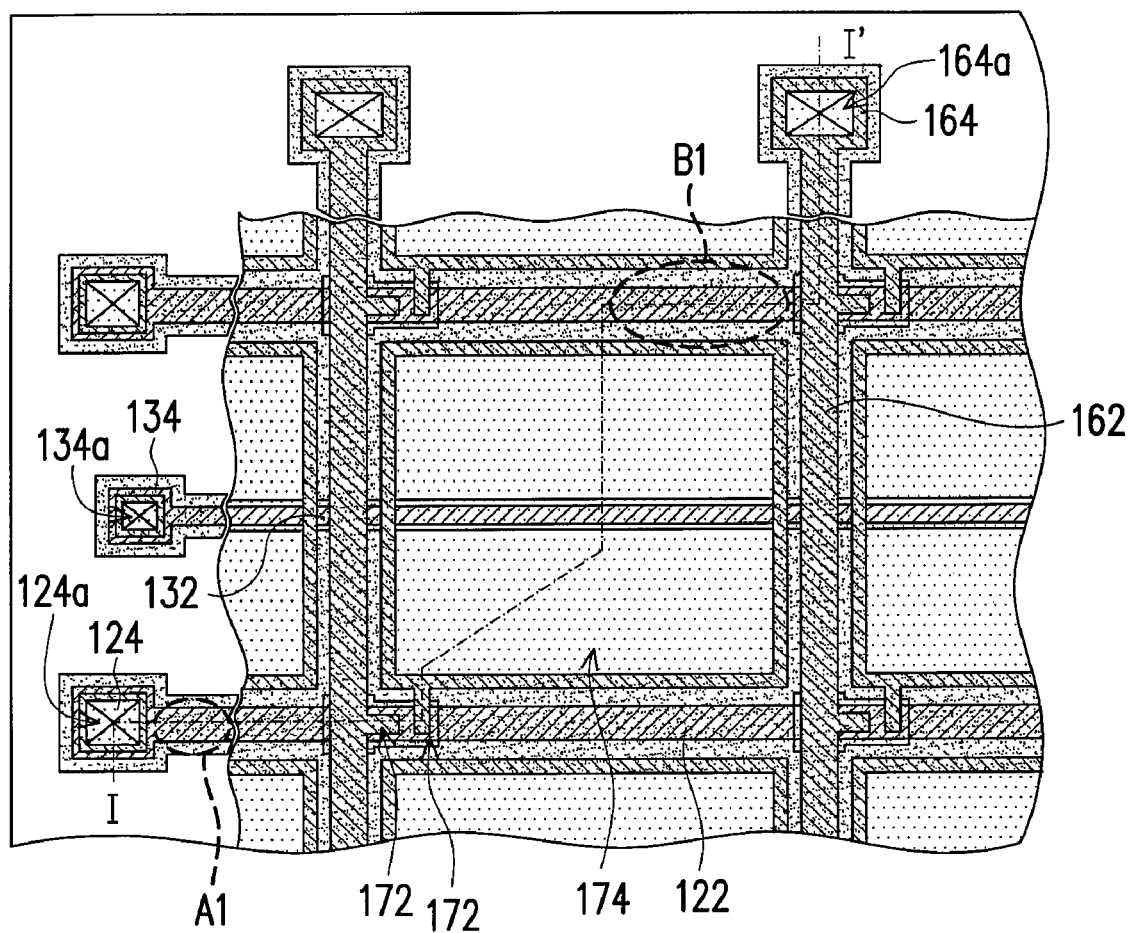

Reference will now be made in detail to the present embodiments of the invention, examples of which are illustrated in the accompanying drawings. Wherever possible, the same reference numbers are used in the drawings and the description to refer to the same or like parts.

In the conventional fabrication method for the TFT array substrate, portions of the scan lines are exposed after the second mask process. The exposed scan lines are damaged and the thickness thereof is reduced in the following mask processes. Even worse, the exposed scan lines may be broken. In the invention, the exposed scan lines are protected by semiconductor layers, ohmic contact layers, transparent conductive layers and metal layers forming the data lines or combination thereof. In the invention, the prior straight common lines are replaced by H-shaped common lines for improving aperture ratio.

First Embodiment

In this embodiment, semiconductor layers, ohmic contact layers, transparent conductive layers and metal layers forming the data lines are used for protecting exposed scan lines. The TFT array substrate made by the fabrication method according to the first embodiment is suitable for the Twisted Nematic Liquid Crystal Display (TN-LCD) display. The storage capacitor is over the common lines but the first embodiment is not limited to this. For example, the storage capacitor may be over the gates. In the first embodiment, the gates of the TFTs are over the scan lines. The first embodiment is not limited to types or configuration of the TFTs. For example, the gates and the scan lines are concurrently formed and coupled to each other.

FIGS. 5A~8A show top views of a TFT array substrate according to the first embodiment of the invention. FIGS. 5B~8B show cross-sectional views taken along the line II-II' in FIGS. 5A~8A. FIGS. 5C~8C show cross-sectional views taken along the line III-III' in FIGS. 5A~8A.

Figure 5A:
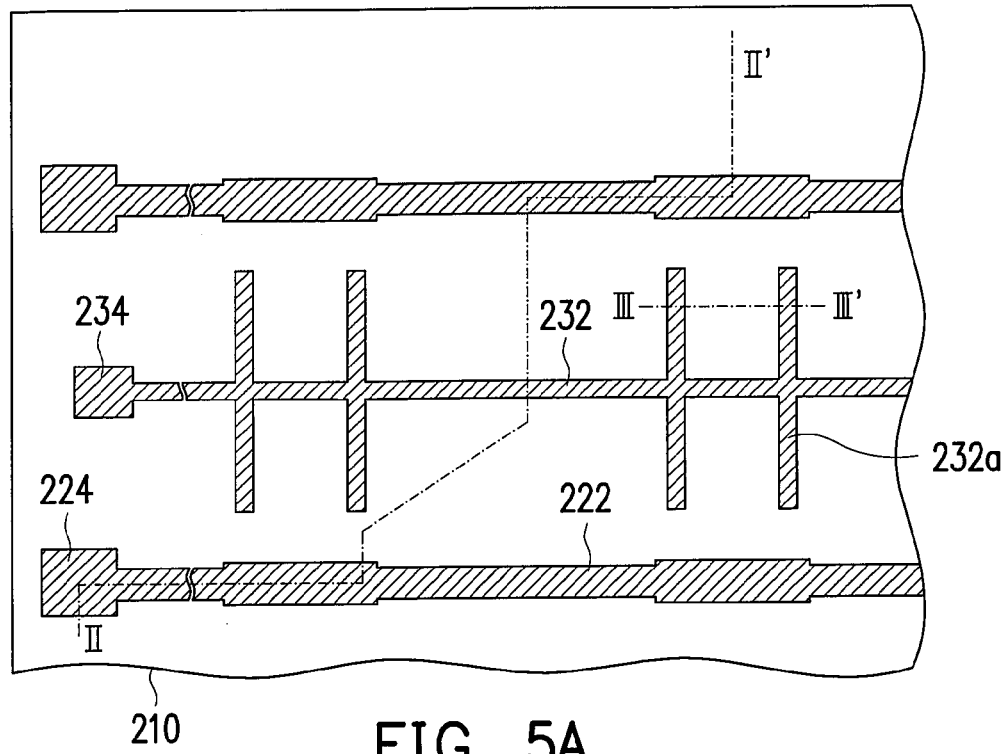
Figure 5B:
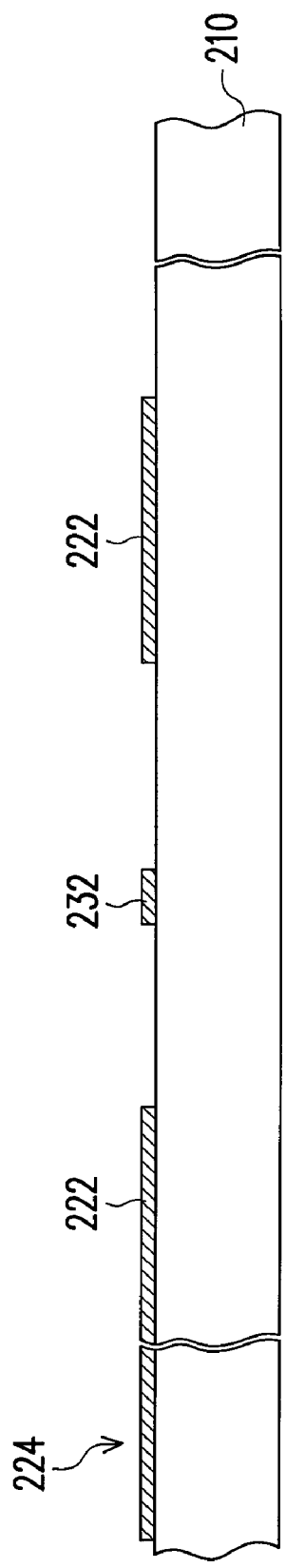
Figure 5C:
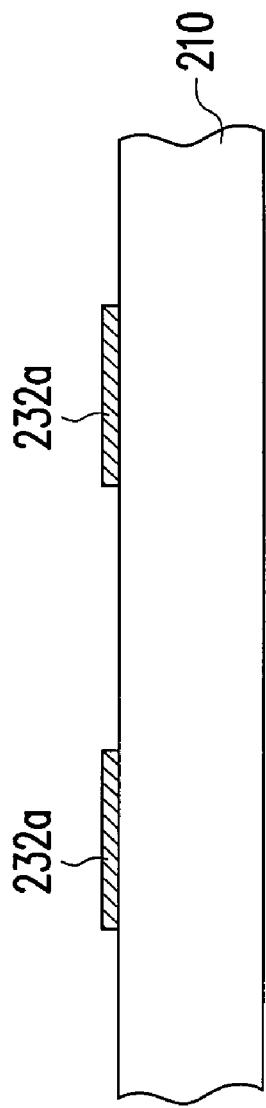

Please refer to FIGS. 5A, 5B and 5C. A substrate 210 is provided. The substrate 210 is for example, a glass substrate, a quartz substrate or substrates made of other transparent materials.

A first metal layer with thickness of several thousand angstroms is formed on the substrate 210 by sputtering process. The first metal layer may be a single layer of aluminum(Al), titanium (Ti), molybdenum (Mo), chromium (Cr), copper (Cu), Al alloy, Cu alloy or nitrides thereof. Alternatively, the first metal layer may be a multi-layer made including combinations of the foregoing single layer. A first mask process is performed on the first metal layer for forming scan lines 222, scan pads 224, common lines 232 and common pads 234. One end of each of the scan lines 222 is electrically connected to one of the scan pads 224 and one end of each of the common lines 232 is electrically connected to one of the common pads 234. The common lines and the scan lines are parallel and alternately disposed on the substrate 210. Each of the common lines 232 has branches 232a extending outwards at edges. The branches 232a of the common lines 232 are used as shield layers of the TFT array substrate for improving the aperture ratio. The branch 232a is optional to the common line 232 and the common line 232 in the second embodiment is applicable in the first embodiment.

Figure 6A:
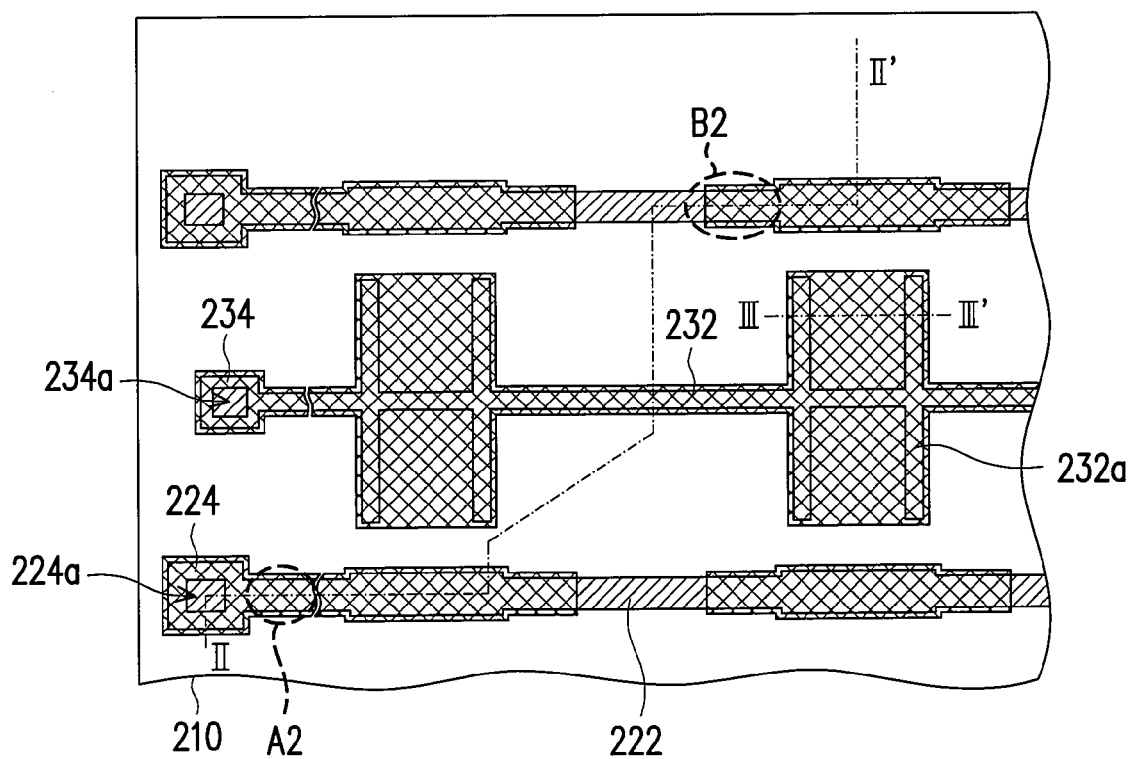
Figure 6B:
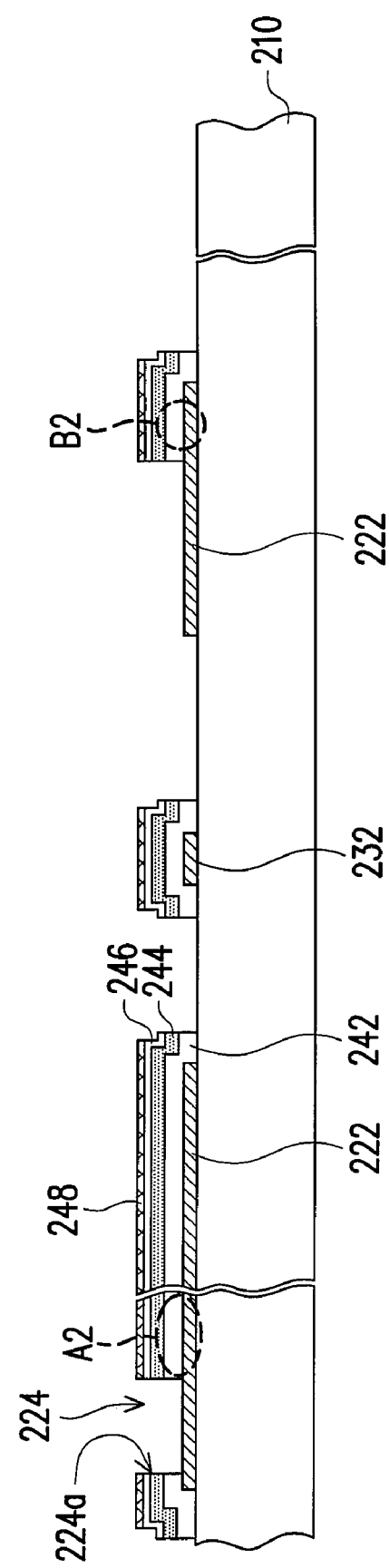
Figure 6C:
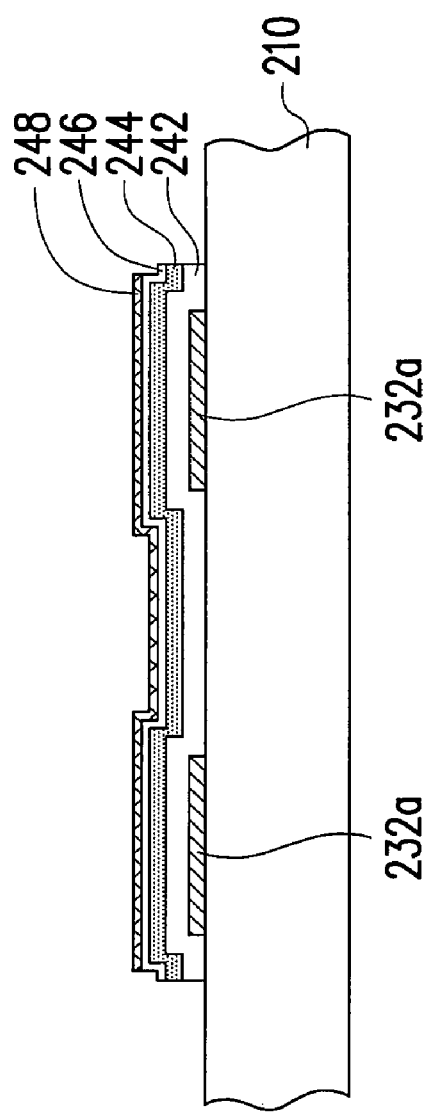

Please refer to FIGS. 6A, 6B and 6C. A dielectric layer and a semiconductor layer are sequentially formed over the substrate 210 by a chemical vapor deposition (CVD) process. The dielectric layer and the semiconductor layer are made of SiNx and a-Si, respectively. For increasing ohmic contact between the semiconductor layer and other layers (for example, the pixel electrodes), an ohmic contact layer and a contact metal layer are sequentially formed over the semiconductor layer. Alternatively, only an ohmic contact layer is formed over the semiconductor layer. In this embodiment, the ohmic contact layer and the contact metal layer are optional. The ohmic contact layer is made of $n^+$-Si. The ohmic contact layer is formed by CVD process. The contact metal layer is formed by sputtering process and includes a single layer made of aluminum (Al), titanium (Ti), molybdenum (Mo), chromium (Cr), Al alloy, Cu alloy or a multi-layer including combinations of the foregoing single layer.

A second mask process is performed on the resulting structure for sequentially forming a patterned dielectric layer 242, a patterned semiconductor layer 244, a patterned ohmic contact layer 246 and a patterned contact metal layer 248. These layers cover the common lines 232 and portions of the scan lines 222 (for example those in the regions A2 and B2, some wiring inside the region A2). These layers 242~248 have multiple first openings 224a and multiple third openings 234a for exposing portions of the scan pads 224 and portions of the common pads 234. The patterned dielectric layer 242, the patterned semiconductor layer 244, the patterned ohmic contact layer 246 and the patterned contact metal layer 248 over other regions should be totally removed for exposing portions of the scan lines 222 (for example the scan lines 222 between the regions B2). For reducing damages to the scan lines 222, an etching process with high selectivity for the scan lines 222 is applied.

In this embodiment, the patterned dielectric layer 242, the patterned semiconductor layer 244, the patterned ohmic contact layer 246 and the patterned contact metal layer 248 cover portions of the scan pads 224 and portions of the common pads 234. Alternatively, the layers 242~248 may entirely expose the scan pads 224 and the common pads 234.

Figure 7A:
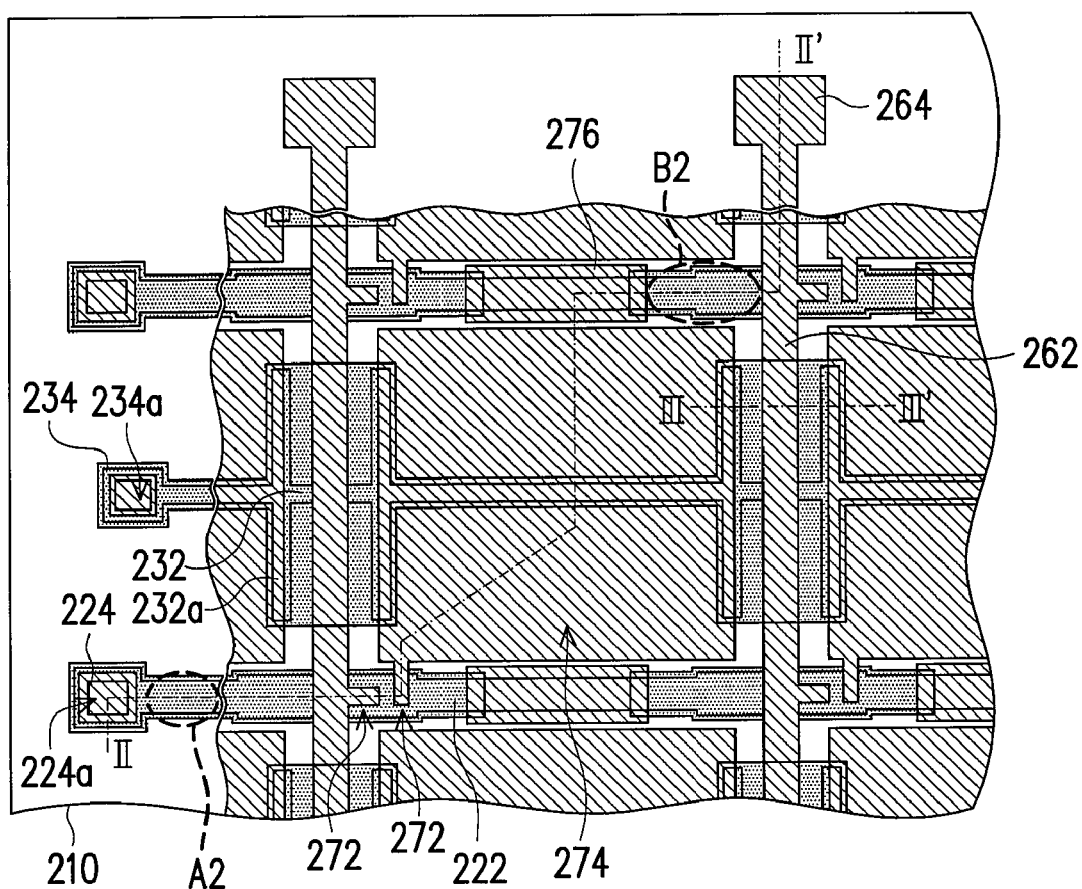
Figure 7C:
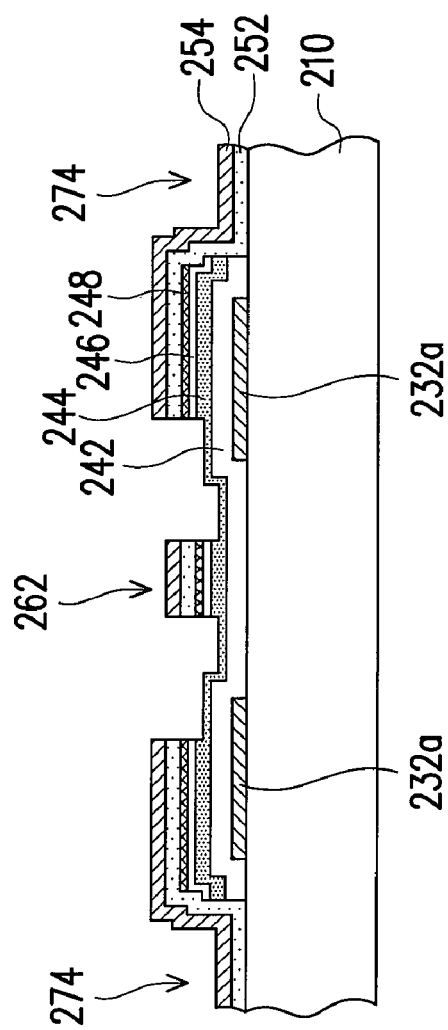

Please refer to FIGS. 7A, 7B and 7C. A transparent conductive layer and a second metal layer are sequentially disposed over the substrate 210. A patterned transparent conductive layer 252 and a patterned second metal layer 254 are formed by a third mask process. The patterned transparent conductive layer 252 is made of, for example but not limited to, indium tin oxide (ITO), indium zinc oxide (IZO), zinc oxide doped with aluminum (ZAO), indium tin zinc oxide (ITZO) or other transparent metal oxides. The patterned second metal layer 254 includes a single layer made of aluminum (Al), titanium (Ti), molybdenum (Mo), chromium (Cr), copper (Cu), Al alloy, Cu alloy or a multi-layer including combinations of the foregoing single layer.

The patterned transparent conductive layer 252 and the patterned second metal layer 254 define data lines 262, data pads 264, source/drain electrodes 272, pixel electrodes 274 and etching protective layers 276. One end of the data lines 262 is electrically connected to one of the data pads 264. The etching protective layers 276 cover and are electrically couple to the scan lines 222 exposed by the patterned dielectric layers 242 and the patterned semiconductor layers 244. The pixel electrodes 274 overlap with portions of the branches 232 of the common lines 232. In this embodiment, the patterned transparent conductive layer 252 and the patterned second metal layer 254 cover the scan pads 224 exposed by the patterned dielectric layer 242, the patterned semiconductor layer 244, the patterned ohmic contact layer 246 and the patterned contact metal layer 248. Alternatively, the patterned transparent conductive layer 252 and the patterned second metal layer 254 may not cover the scan pads 224.

Because the etching protective layers 276, including the patterned transparent conductive layer 252 and the patterned second metal layer 254, cover the scan lines 222 exposed by the patterned dielectric layer 242 and the patterned semiconductor layer 244, the etching protective layers 276 protect the scan lines 222 in the following etching processes. Because the patterned transparent conductive layer 252 and the patterned second metal layer 254 are both conductive and the etching protective layers 276 contact with the scan lines 222, the etching protective layers 276 are parallel electrically connected to the scan lines 222. Due to the parallel electrically connecting between the etching protective layers 276 and the scan lines 222, the resistance of the scan lines 222 is reduced for reducing the RC delay.

Furthermore, the patterned contact metal layer 248, the patterned ohmic contact layer 246, and portions of the patterned semiconductor layer 244 in other regions (for example, in a channel region, the region A1, and the region B1) exposed by the patterned transparent conductive layer 252 and the patterned metal layer 254 are further removed. Thereby, the portions of the patterned semiconductor layer 244 in the regions are exposed.

Figure 8A:
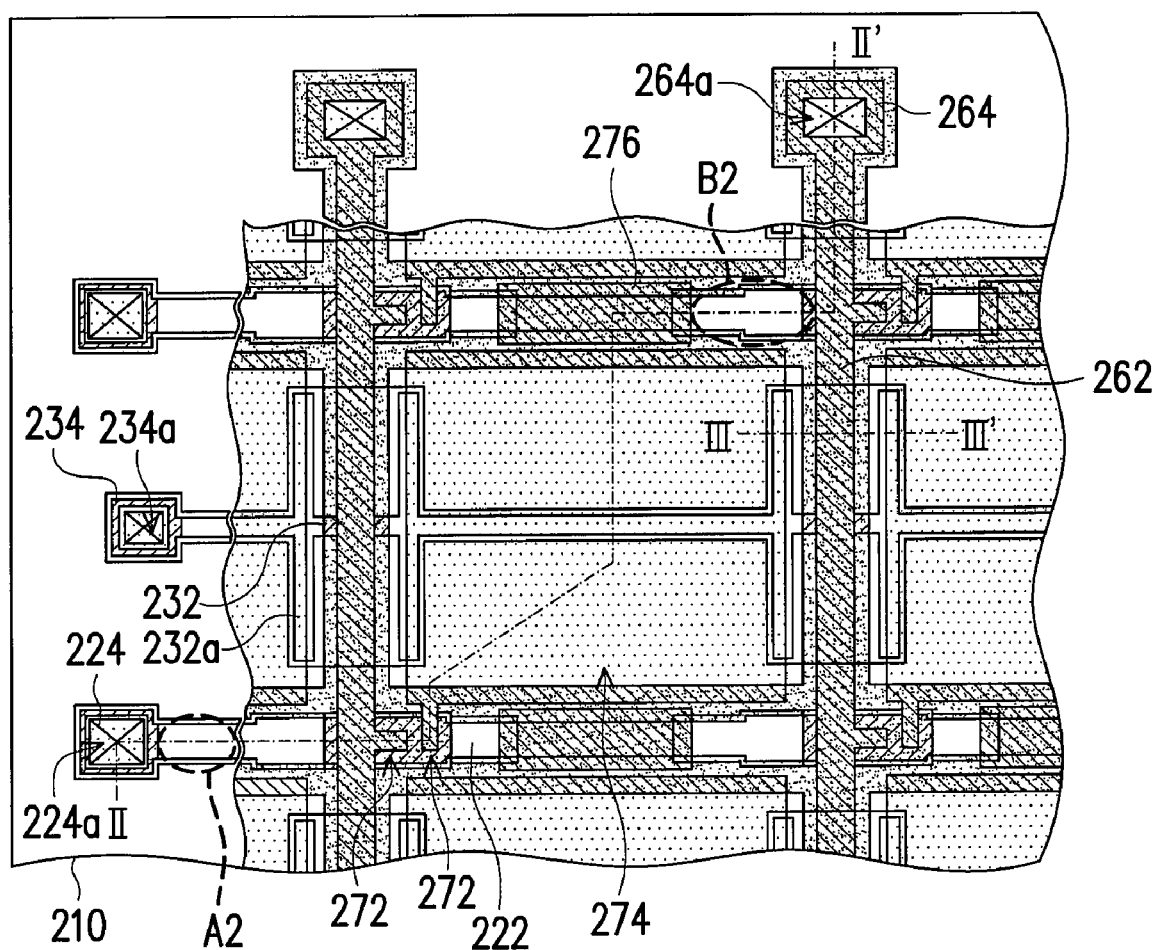
Figure 8C:
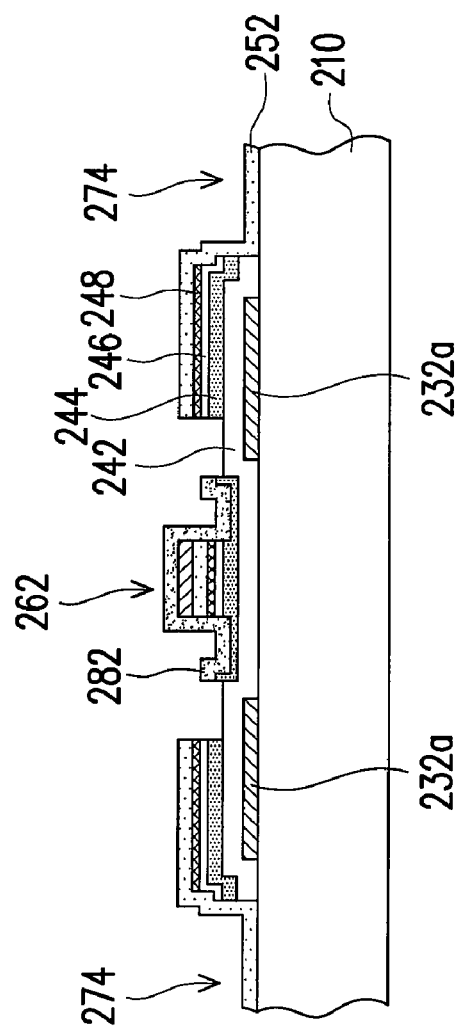

Please refer to FIGS. 8A, 8B and 8C, a passivation layer 282 is formed over the substrate 210. The passivation layer 282 is made of SiNx. A fourth mask process is performed for removing the passivation layer 282 and the patterned second metal layer 254 over the pixel electrodes 274 to expose the patterned transparent conductive layer 252 of the pixel electrodes 274. The patterned semiconductor layer 244 over the scan lines 222 between the etching protective layers 276 and the data lines 262 is removed for exposing the patterned dielectric layer 242 over the scan lines 222 (in regions A2 and B2). Each of the data lines 262 is electrically insulated from each other. The TFT array substrate according to the first embodiment is almost completed.

In the first embodiment, second openings 264a are formed in the passivation layer 282 and the patterned second metal layer 254 for exposing portions of the data pads 264. The passivation layer 282 and the patterned second metal layer 254 over the scan pads 224 and the common pads 234 are totally removed.

Second Embodiment

Similar to the first embodiment, in the second embodiment, the semiconductor, the ohmic contact layer, the transparent conductive layer and the metal layer are used for protecting the exposed scan lines. The TFT array substrate made by the method according to the second embodiment is suitable for a vertically alignment LCD (VA-LCD). The storage capacitor may be on the common lines or on the gates. The gates of the TFTs in the second embodiment are on the scan lines. The second embodiment is not limited to this. For example, the gates and the scan lines are concurrently formed and electrically connected to each other.

FIGS. 9A~12A show top views of a TFT array substrate according to the second embodiment of the invention. FIGS. 9B~12B show cross-sectional views taken along the line II-II' in FIGS. 9A~12A.

Figure 9A:
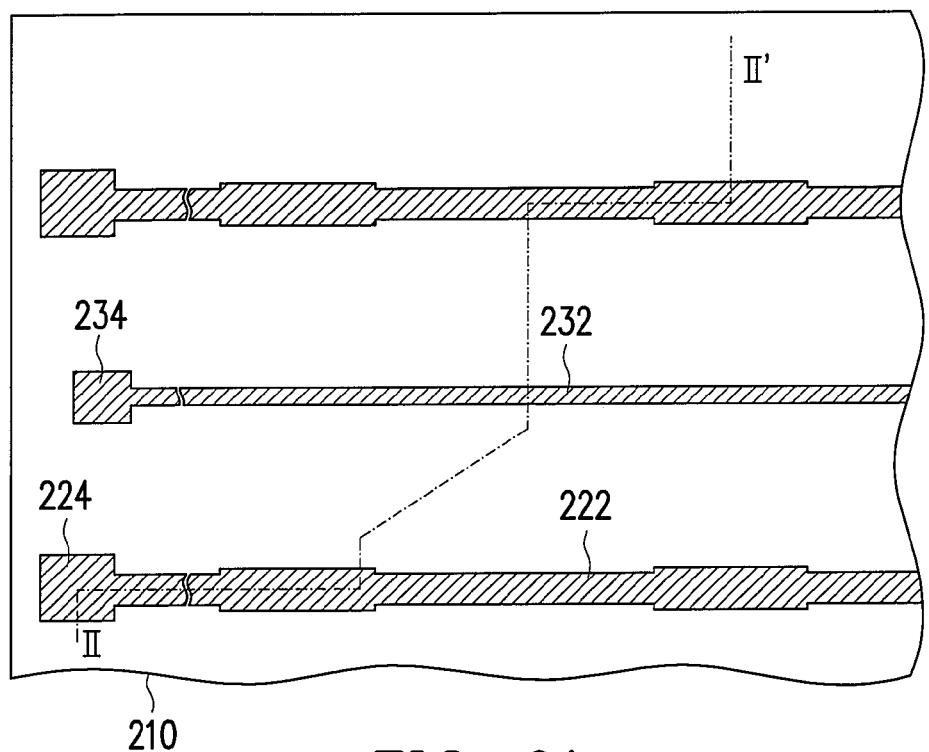
Figure 9B:
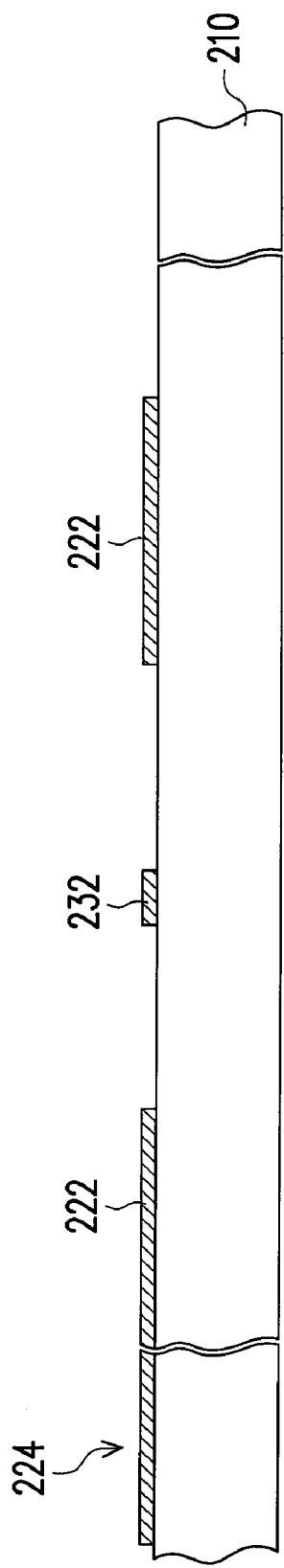

Please refer to FIGS. 9A and 9B. A substrate 210 is provided. Scan lines 222, scan pads 224, common lines 232 and common pads 234 are formed over the substrate 210. The difference between the second embodiment and the first embodiment relies on that the common lines 232 in the second embodiment do not include any branch. But, the common lines 232 with the branches 232a in the first embodiment are still suitable in the second embodiment.

Figure 10A:
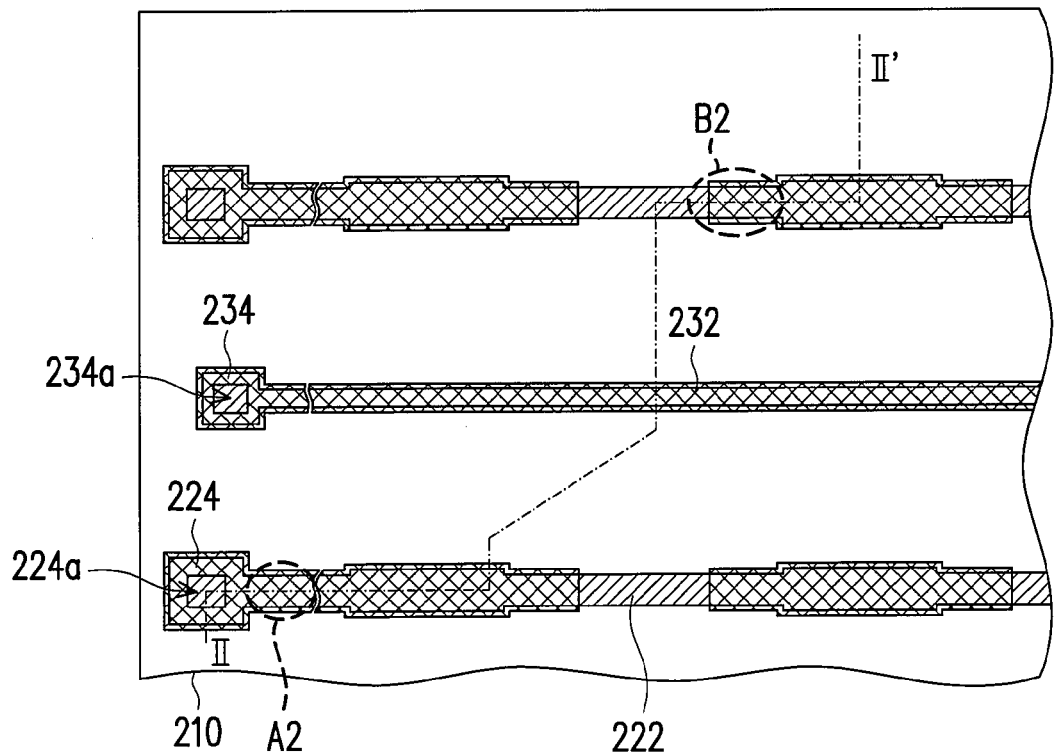
Figure 10B:
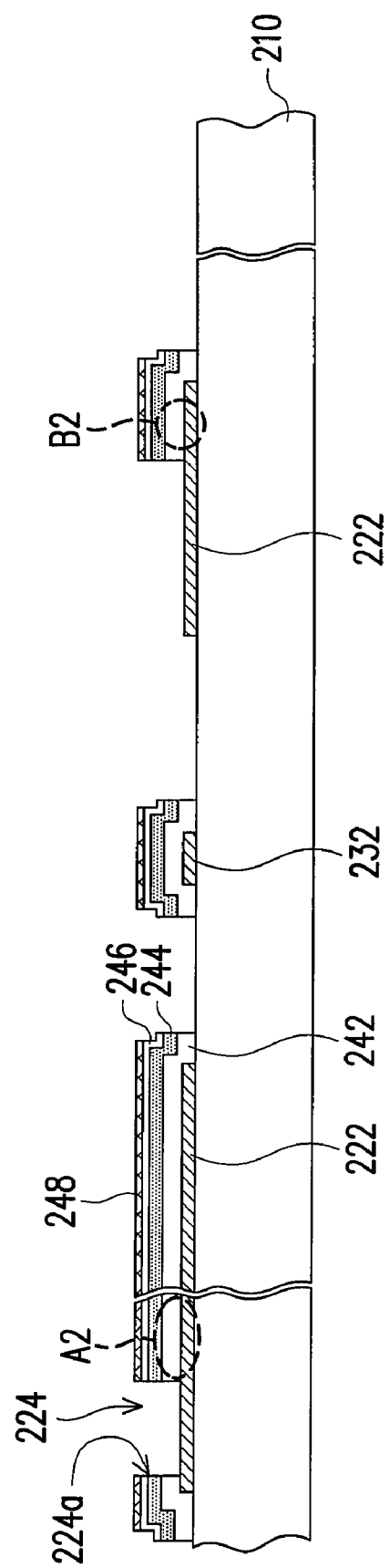

Please refer to FIGS. 10A and 10B. The second mask process in the second embodiment is similar to that in the first embodiment. A patterned dielectric layer 242, a patterned semiconductor layer 244, a patterned ohmic contact layer 246 and a patterned contact metal layer 248 are sequentially formed over the substrate 210. The layers 242~248 cover the common lines 232 and portions of the scan lines 222 (for example, those in the regions A2 and B2, wherein there are some wires in the region A2).

Figure 11A:
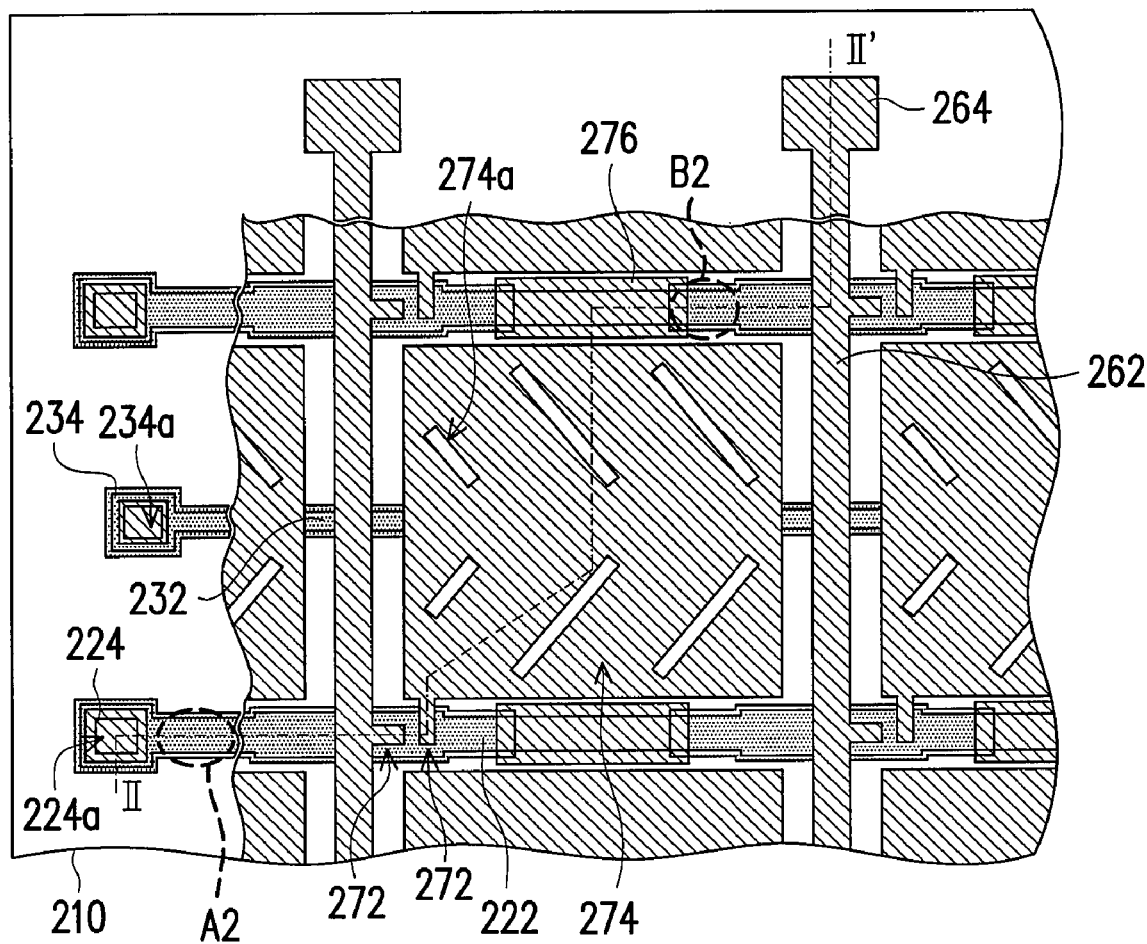

Please refer to FIGS. 11A and 11B. The third mask process in the second embodiment is also similar to that in the first embodiment, for forming a patterned transparent conductive layer 252 and a patterned second metal layer 254. The patterned transparent conductive layer 252 and the patterned second metal layer 254 define data lines 262, data pads 264, source/drain electrodes 272, pixel electrodes 274 and etching protective layers 276. The difference relies on that, there are slits 274a in the pixel electrodes 274 and the slits 274a expose a portion of the surface of the substrate 210.

Furthermore, the patterned contact metal layer 248, the patterned ohmic contact layer 246, and portions of the patterned semiconductor layer 244 in other regions (for example, in a channel region, the region A1, and the region B1) exposed by the patterned transparent conductive layer 252 and the patterned metal layer 254 are further removed. Thereby, the portions of the patterned semiconductor layer 244 in the regions are exposed.

Figure 12A:
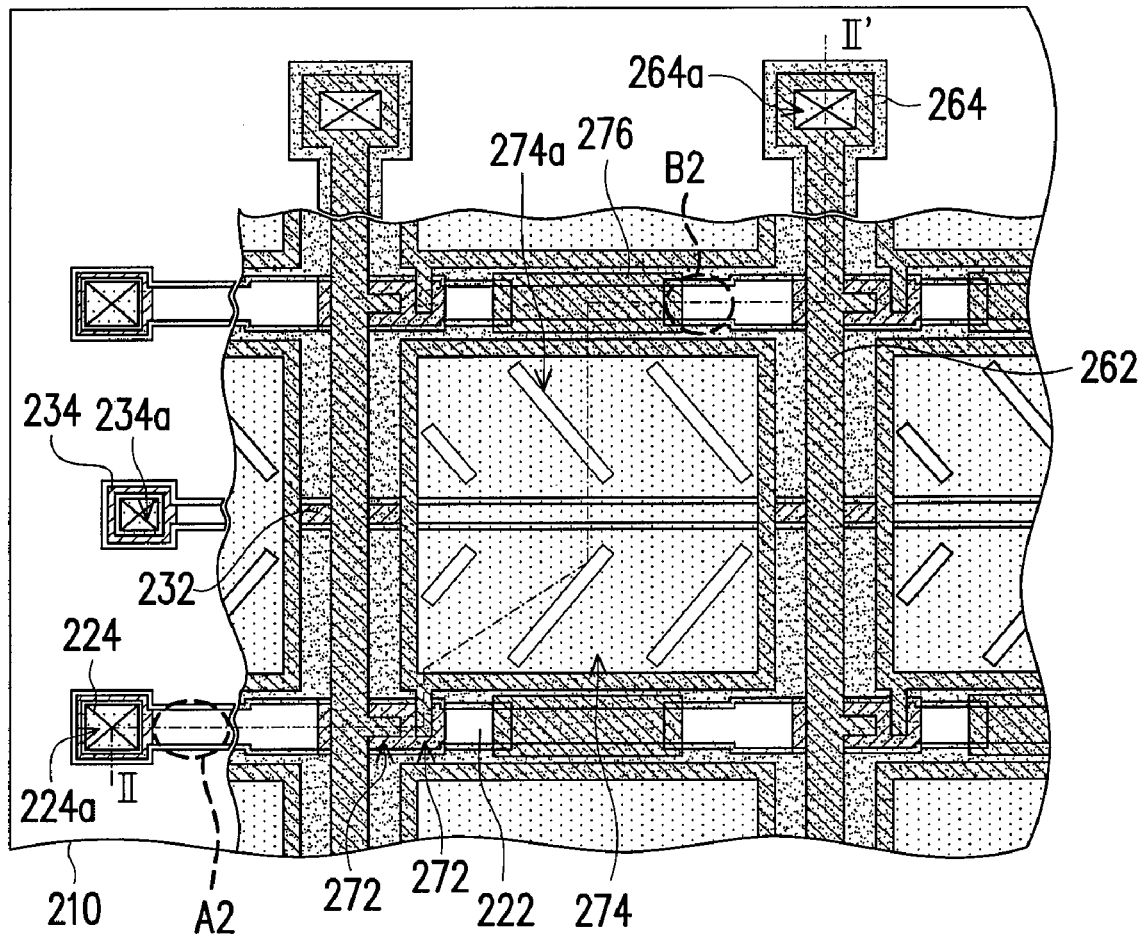

Please refer to FIGS. 12A and 12B, a passivation layer 282 is formed over the substrate 210. The passivation layer 282 is made of SiNx. The fourth mask process in the second embodiment is also similar to that in the first embodiment, for removing the passivation layer 282 and the patterned second metal layer 254 in some regions to expose the patterned transparent conductive layer 252 of the pixel electrodes 274. The patterned semiconductor layer 244 over portions of the scan lines 222 is also removed for exposing the patterned dielectric layer 242, as shown in the regions A2 and B2. The TFT array substrate according to the second embodiment is almost completed.

Third Embodiment

In the third embodiment, the semiconductor layer and the ohmic contact layer are used for protecting the exposed scan line. The TFT array substrate made by the method according to the third embodiment is suitable for TN-LCD. The storage capacitor is on the common lines and the third embodiment is not limited to this. For example, the storage capacitor may be on the gates. In the third embodiment, the gates of the TFTs are on the scan lines. The third embodiment is not limited to types or configuration of the TFTs. For example, the gates and the scan lines are concurrently formed and coupled to each other.

FIGS. 13A~16A show top views of a TFT array substrate according to the third embodiment of the invention. FIGS. 13B~16B show cross-sectional views taken along the line II-II' in FIGS. 13A~16A. FIGS. 13C~16C show cross-sectional views taken along the line III-III' in FIGS. 13A~16A.

Figure 13A:
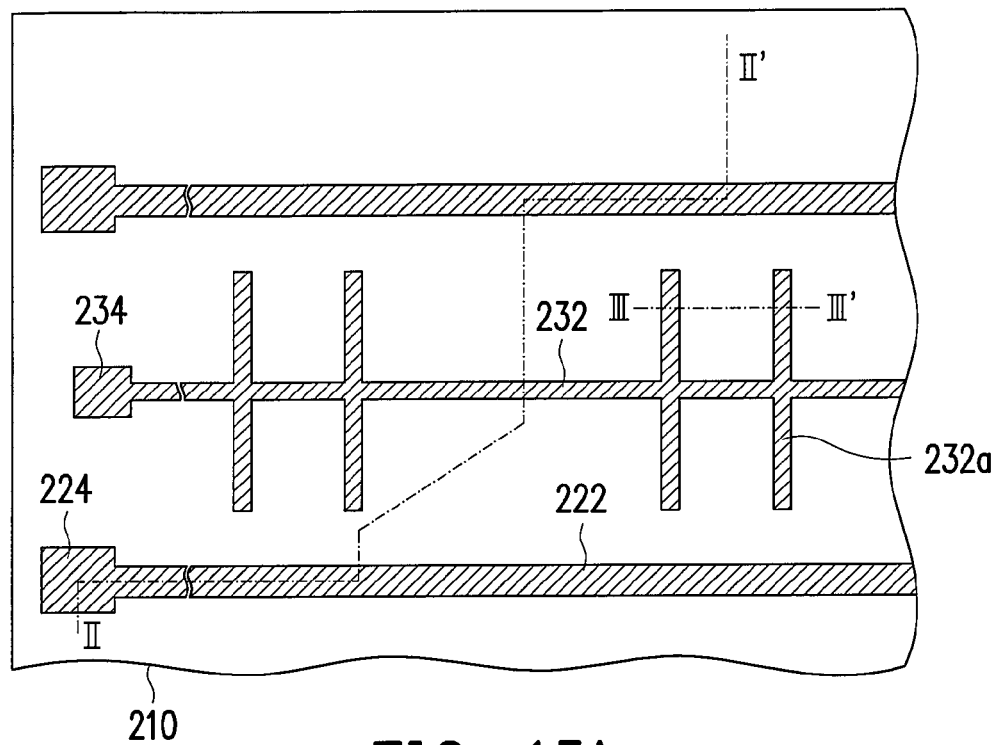

Please refer to FIGS. 13A, 13B and 13C. The first mask process in the third embodiment is similar to that in the first embodiment. Scan lines 222, scan pads 224, common lines 232 and common pads 234 are formed over the substrate 210. The straight-type common lines 232 in the second embodiment are suitable in the third embodiment.

Figure 14A:
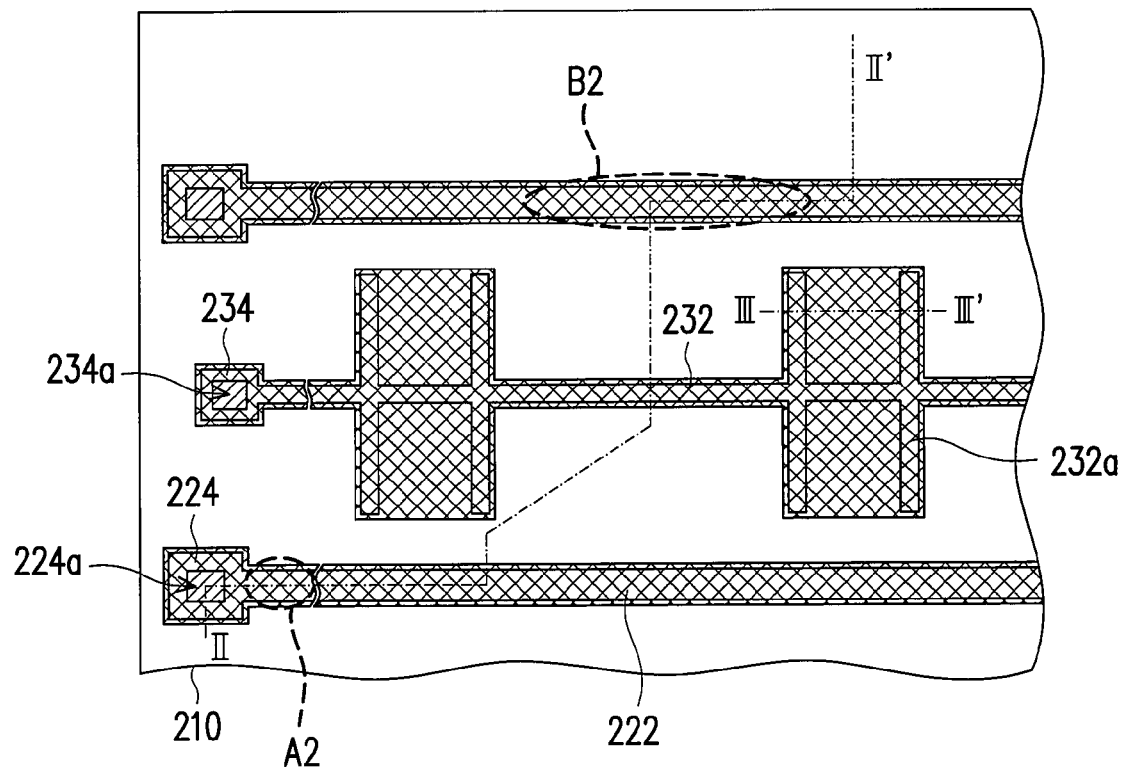

Please refer to FIGS. 14A, 14B and 14C. The second mask process in the third embodiment is similar to that in the first embodiment. A patterned dielectric layer 242, a patterned semiconductor layer 244, a patterned ohmic contact layer 246 and a patterned contact metal layer 248 are sequentially formed over the substrate 210. The difference between the first embodiment and the third embodiment relies on that, the layers 242~248 cover entire of the common lines 232 and the scan lines 222. The formation of the patterned ohmic contact layer 246 and the patterned contact metal layer 248 is optional.

Figure 15A:
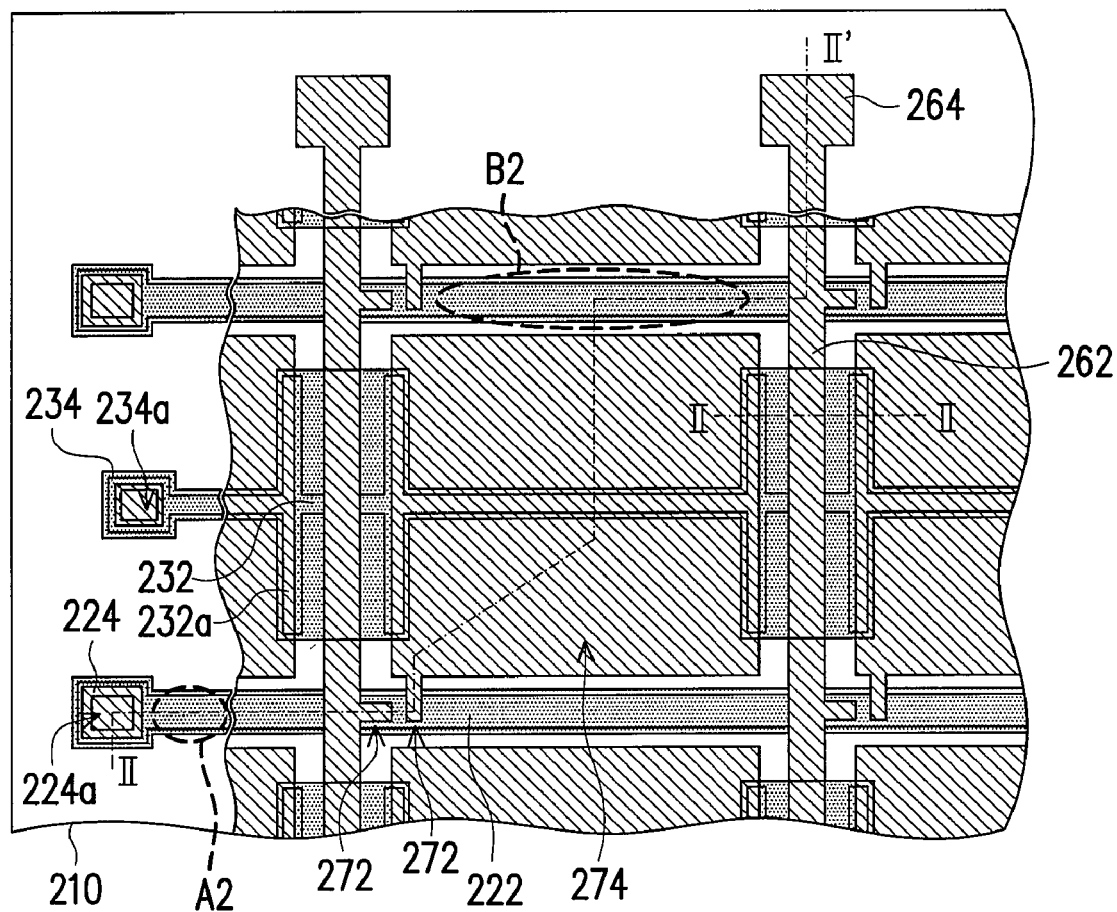

Please refer to FIGS. 15A, 15B and 15C. The third mask process in the third embodiment is also similar to that in the first embodiment, for forming a patterned transparent conductive layer 252 and a patterned second metal layer 254. The patterned transparent conductive layer 252 and the patterned second metal layer 254 define data lines 262, data pads 264, source/drain electrodes 272 and pixel electrodes 274. The difference between the first embodiment and the third embodiment relies on that, no etching protective layers 276 are formed. Besides, the patterned transparent conductive layer 252 and the patterned second metal layer 254 expose a portion of the patterned semiconductor layer 244 over the scan lines 222 (regions A2 and B2, for example).

Furthermore, the patterned contact metal layer 248, the patterned ohmic contact layer 246, and portions of the patterned semiconductor layer 244 in other regions (for example, in a channel region, the region A1, and the region B1) exposed by the patterned transparent conductive layer 252 and the patterned metal layer 254 are further removed. Thereby, the portions of the patterned semiconductor layer 244 in the regions are exposed.

Figure 16A:
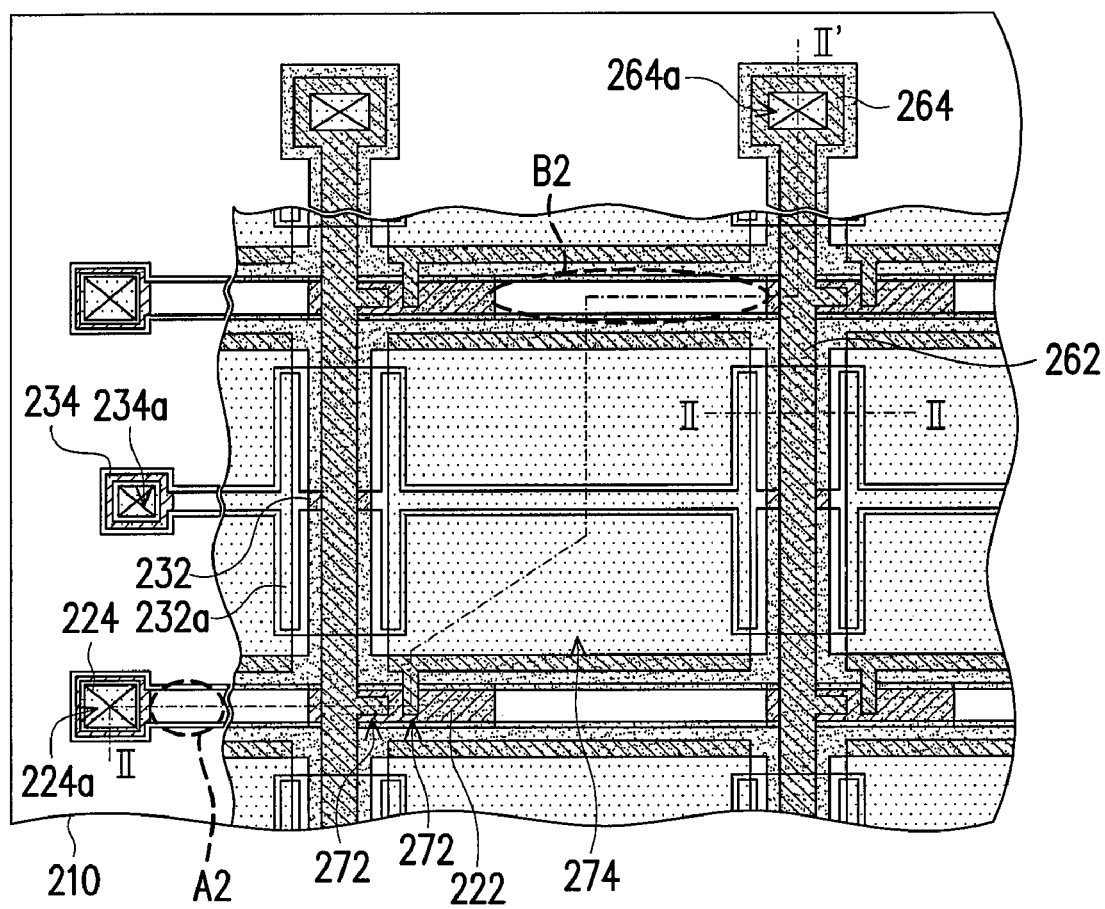

Please refer to FIGS. 16A, 16B and 16C, a passivation layer 282 is formed over the substrate 210. The passivation layer 282 is made of SiNx. The fourth mask process in the third embodiment is also similar to that in the first embodiment, for removing the passivation layer 282 and the patterned second metal layer 254 in some regions to expose the patterned transparent conductive layer 252 of the pixel electrodes 274. The patterned semiconductor layer 244 over portions of the scan lines 222 is also removed for exposing the patterned dielectric layer 242, as shown in the regions A2 and B2. The TFT array substrate according to the third embodiment is almost completed.

Fourth Embodiment

In the fourth embodiment, the semiconductor layer and the ohmic contact layer are used for protecting the exposed scan lines and the pixel electrodes cover the semiconductor layer over the scan lines for increasing the aperture ratio. The TFT array substrate made by the fourth embodiment is suitable for TN-LCD. The storage capacitor is on the common lines. In the fourth embodiment, the gates of the TFTs are on the scan lines. The fourth embodiment is not limited to types or configuration of the TFTs. For example, the gates and the scan lines are concurrently formed and coupled to each other.

FIGS. 17A~20A show top views of a TFT array substrate according to the fourth embodiment of the invention. FIGS. 17B~20B show cross-sectional views taken along the line II-II' in FIGS. 17A~20A. FIGS. 17C~20C show cross-sectional views taken along the line III-III' in FIGS. 17A~20A.

Figure 17A:
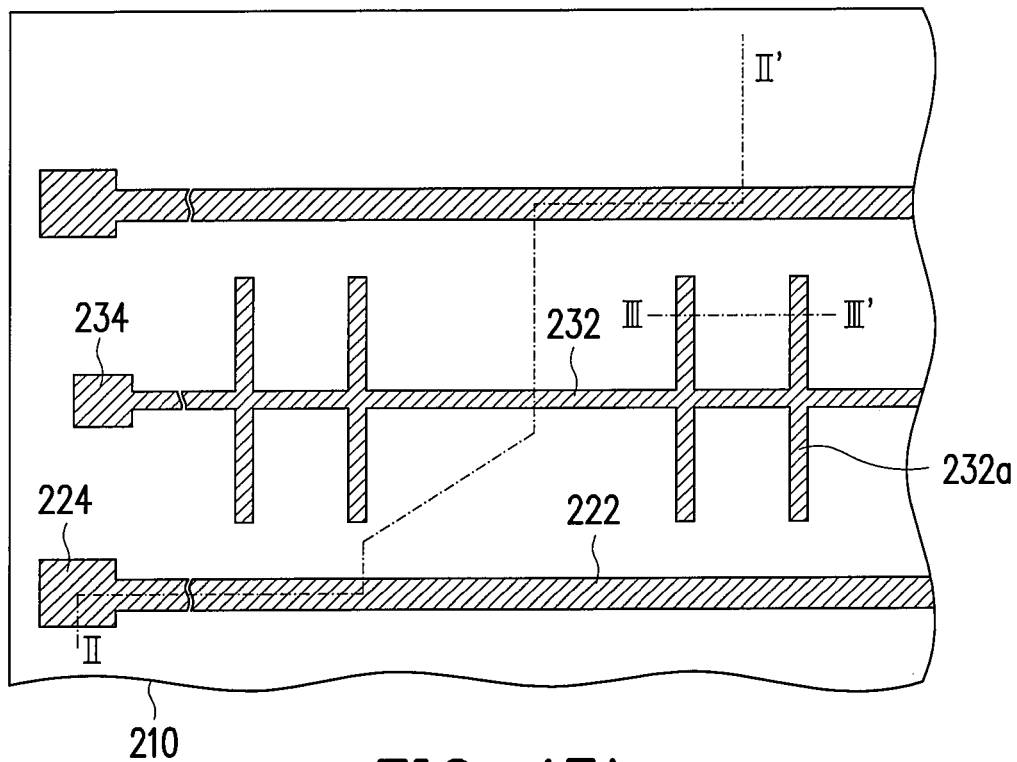
Figure 17B:
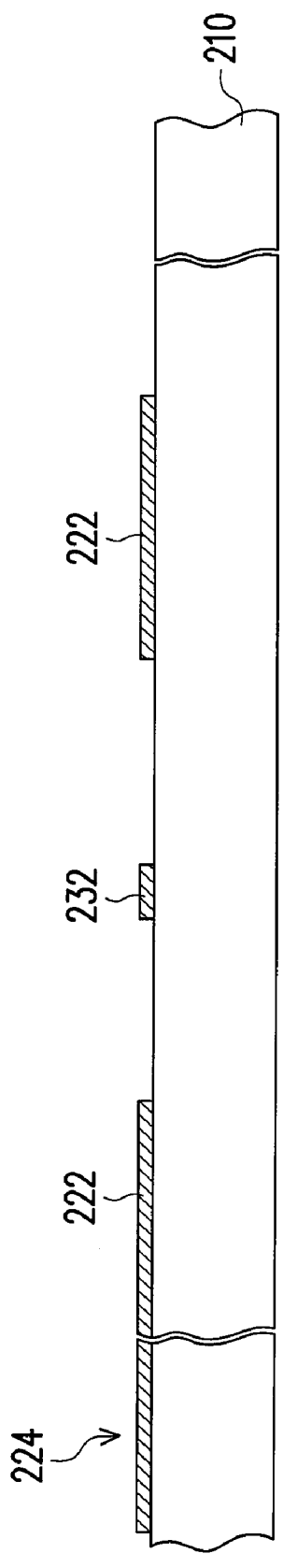

Please refer to FIGS. 17A, 17B and 17C. The first mask process in the fourth embodiment is similar to that in the third embodiment. Scan lines 222, scan pads 224, common lines 232 and common pads 234 are formed over the substrate 210. The straight-type common lines 232 in the second embodiment are suitable in the fourth embodiment.

Figure 18A:
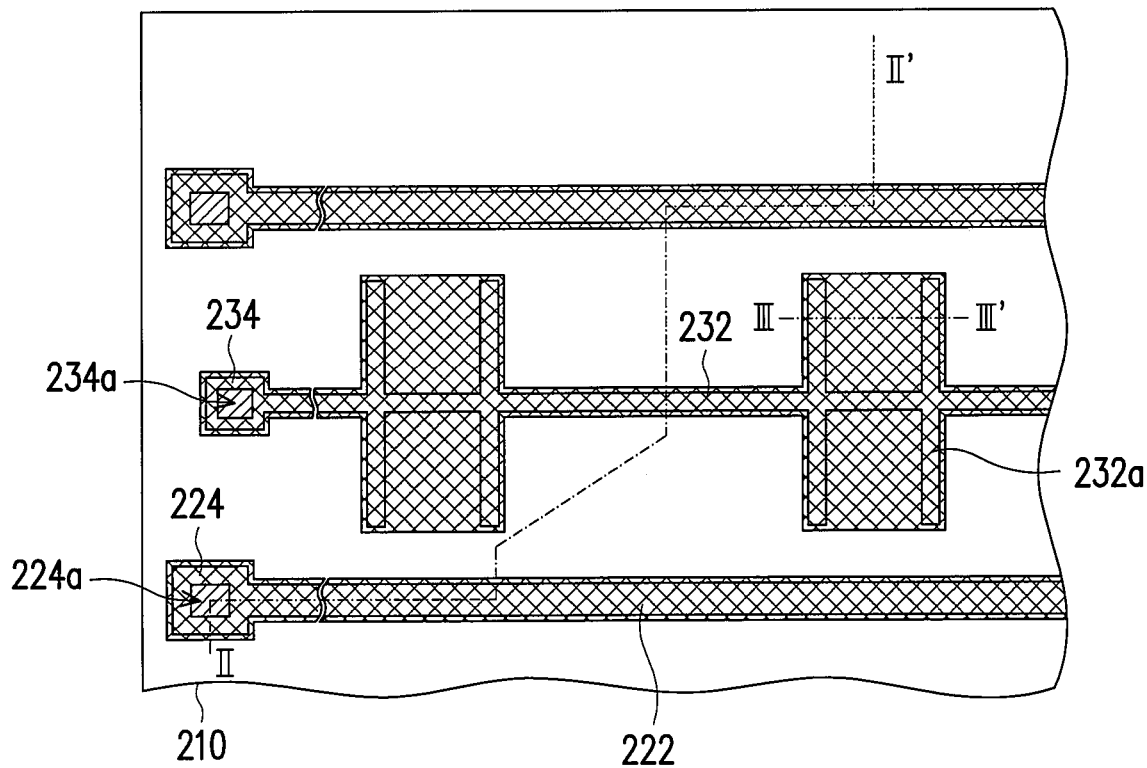
Figure 18B:
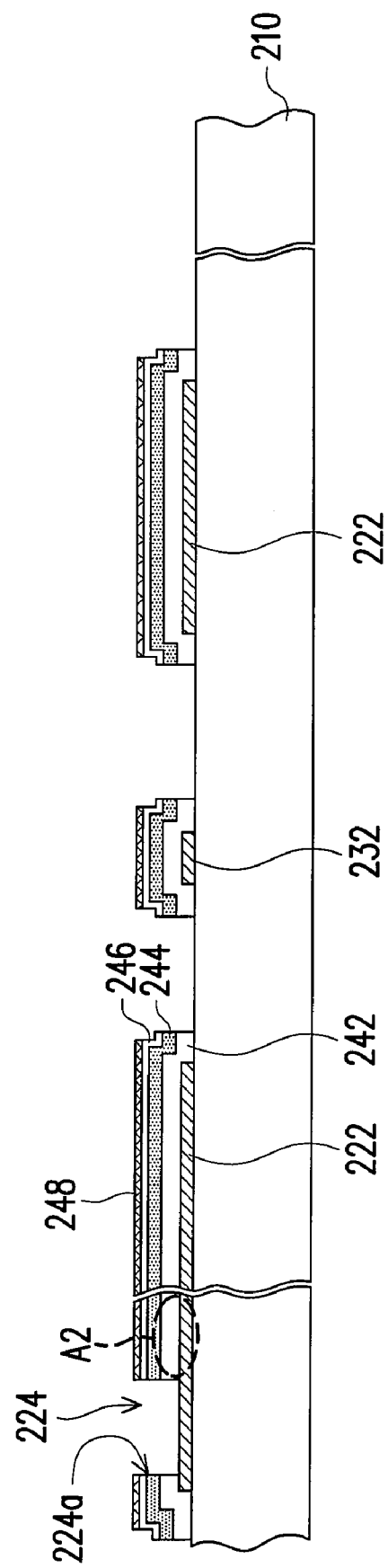

Please refer to FIGS. 18A, 18B and 18C. The second mask process in the fourth embodiment is similar to that in the third embodiment. A patterned dielectric layer 242, a patterned semiconductor layer 244, a patterned ohmic contact layer 246 and a patterned contact metal layer 248 are sequentially formed over the substrate 210. The layers 242~248 cover entire of the common lines 232 and the scan lines 222.

Figure 19A:
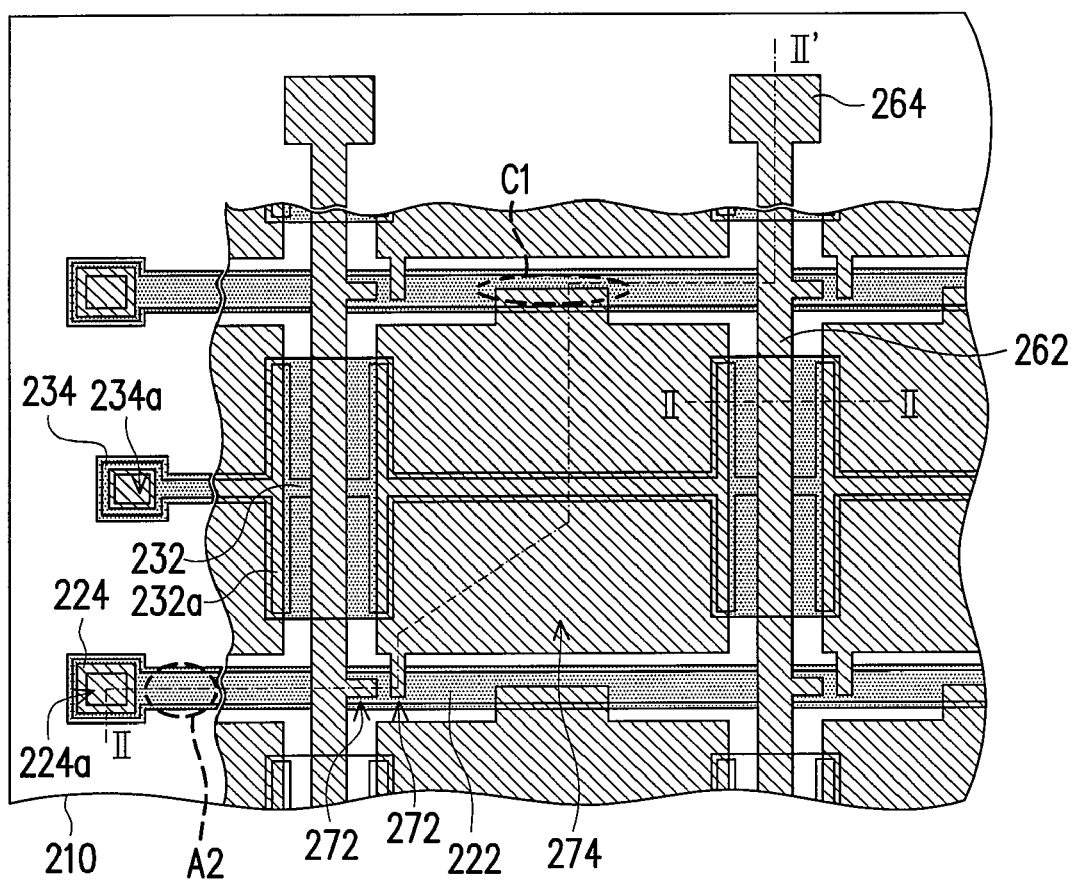
Figure 19C:
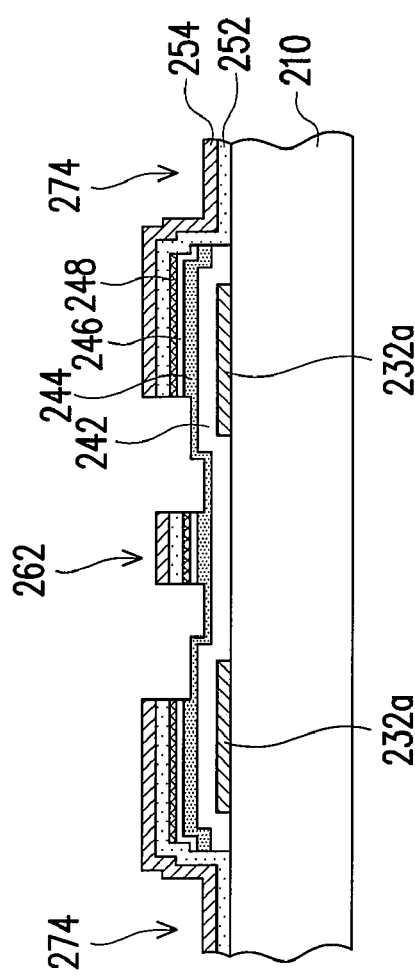

Please refer to FIGS. 19A, 19B and 19C. The third mask process in the fourth embodiment is also similar to that in the third embodiment, for forming a patterned transparent conductive layer 252 and a patterned second metal layer 254. The patterned transparent conductive layer 252 and the patterned second metal layer 254 define data lines 262, data pads 264, source/drain electrodes 272 and pixel electrodes 274. The difference between the fourth embodiment and the third embodiment relies on that, the pixel electrodes 274 in the fourth embodiment covers portions of the scan lines 222 (as shown in the region C1) and the pixel electrodes 274 are stacked over the multilayer over the scan lines 222 (for example, the patterned dielectric layer 242, the patterned semiconductor layer 244, the patterned ohmic contact layer 246 and the patterned contact metal layer 248). Besides, because the pixel electrodes 274 cover portions of the scan lines 222, the aperture ratio is further improved.

Furthermore, the patterned contact metal layer 248, the patterned ohmic contact layer 246, and portions of the patterned semiconductor layer 244 in other regions (for example, in a channel region, the region A1, and the region B1) exposed by the patterned transparent conductive layer 252 and the patterned metal layer 254 are further removed. Thereby, the portions of the patterned semiconductor layer 244 in the regions are exposed.

Figure 20C:
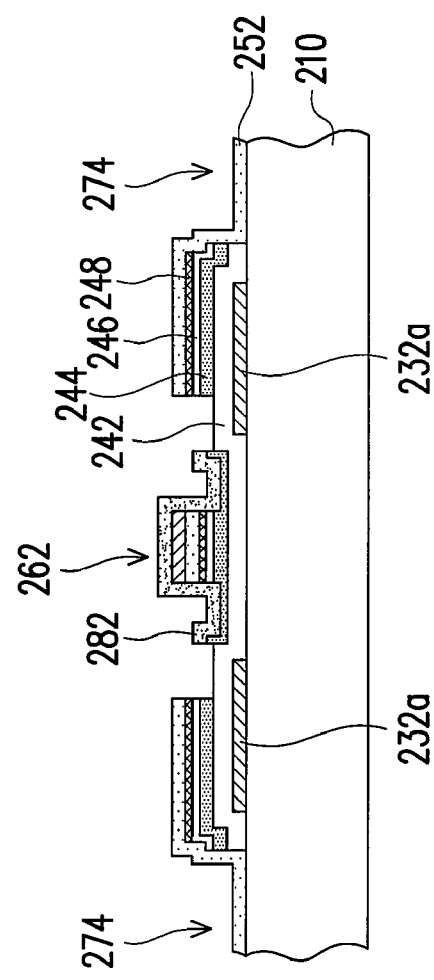
Figure 20A:
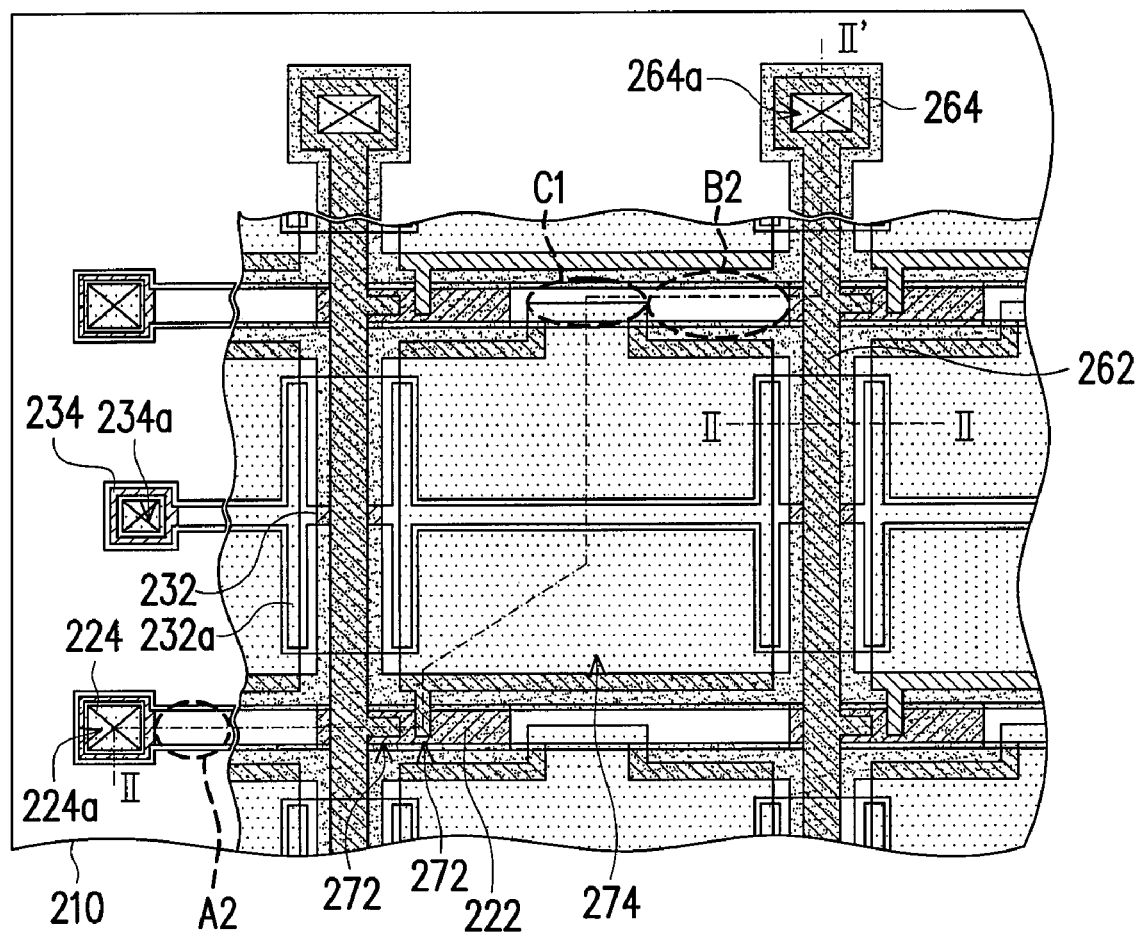

Please refer to FIGS. 20A, 20B and 20C, a passivation layer 282 is formed over the substrate 210. The passivation layer 282 is made of SiNx. The fourth mask process in the fourth embodiment is also similar to that in the third embodiment, for removing the passivation layer 282 and the patterned second metal layer 254 in some regions to expose the patterned transparent conductive layer 252 of the pixel electrodes 274. The patterned semiconductor layer 244 over portions of the scan lines 222 is also removed for exposing the patterned dielectric layer 242, as shown in the regions A2 and B2. The TFT array substrate according to the fourth embodiment is almost completed.

Fifth Embodiment

In the fifth embodiment, the semiconductor layer and the ohmic contact layer are used for protecting the exposed scan lines and the pixel electrodes cover the semiconductor layer over the scan lines for increasing the aperture ratio. The TFT array substrate made by the method according to the fifth embodiment is suitable for TN-LCD. The storage capacitor is on the gate. In the fifth embodiment, the gates of the TFTs are on the scan lines. The fifth embodiment is not limited to types or configuration of the TFTs. For example, the gates and the scan lines are concurrently formed and coupled to each other.

FIGS. 21A~24A show top views of a TFT array substrate according to the fifth embodiment of the invention. FIGS. 21B~24B show cross-sectional views taken along the line II-II' in FIGS. 21A~24A.

Figure 21A:
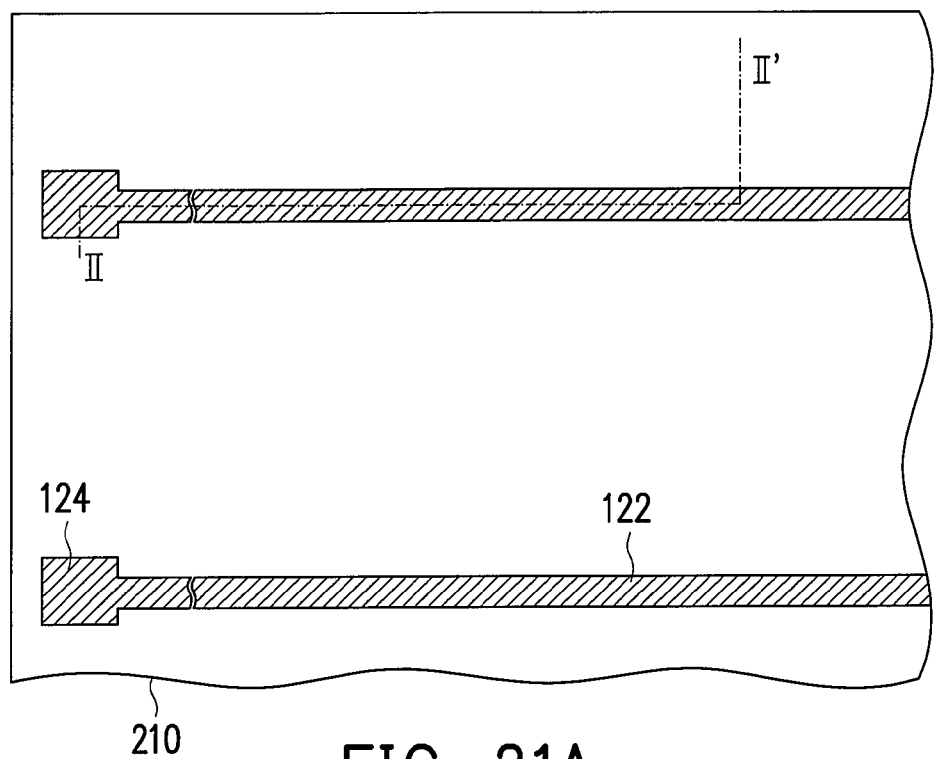

Please refer to FIGS. 21A and 21B. The first mask process in the fifth embodiment is similar to that in the fourth embodiment. Scan lines 222 and scan pads 224 are formed over the substrate 210. However, the difference between the fifth embodiment and the fourth embodiment relies on that, the common lines 232 and the common pads 234 formed in the fourth embodiment are not formed in the fifth embodiment.

Figure 22A:
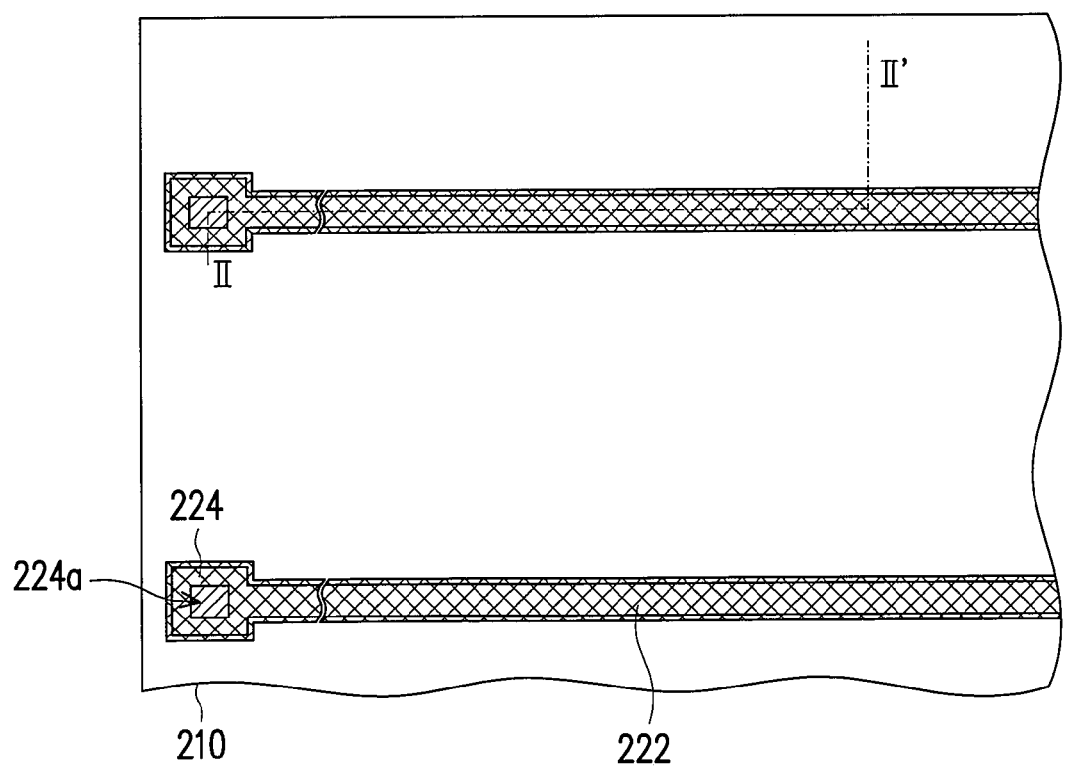

Please refer to FIGS. 22A and 22B. The second mask process in the fifth embodiment is similar to that in the fourth embodiment. A patterned dielectric layer 242, a patterned semiconductor layer 244, a patterned ohmic contact layer 246 and a patterned contact metal layer 248 are sequentially formed over the substrate 210. The layers 242~248 cover entire of the scan lines 222.

Figure 23A:
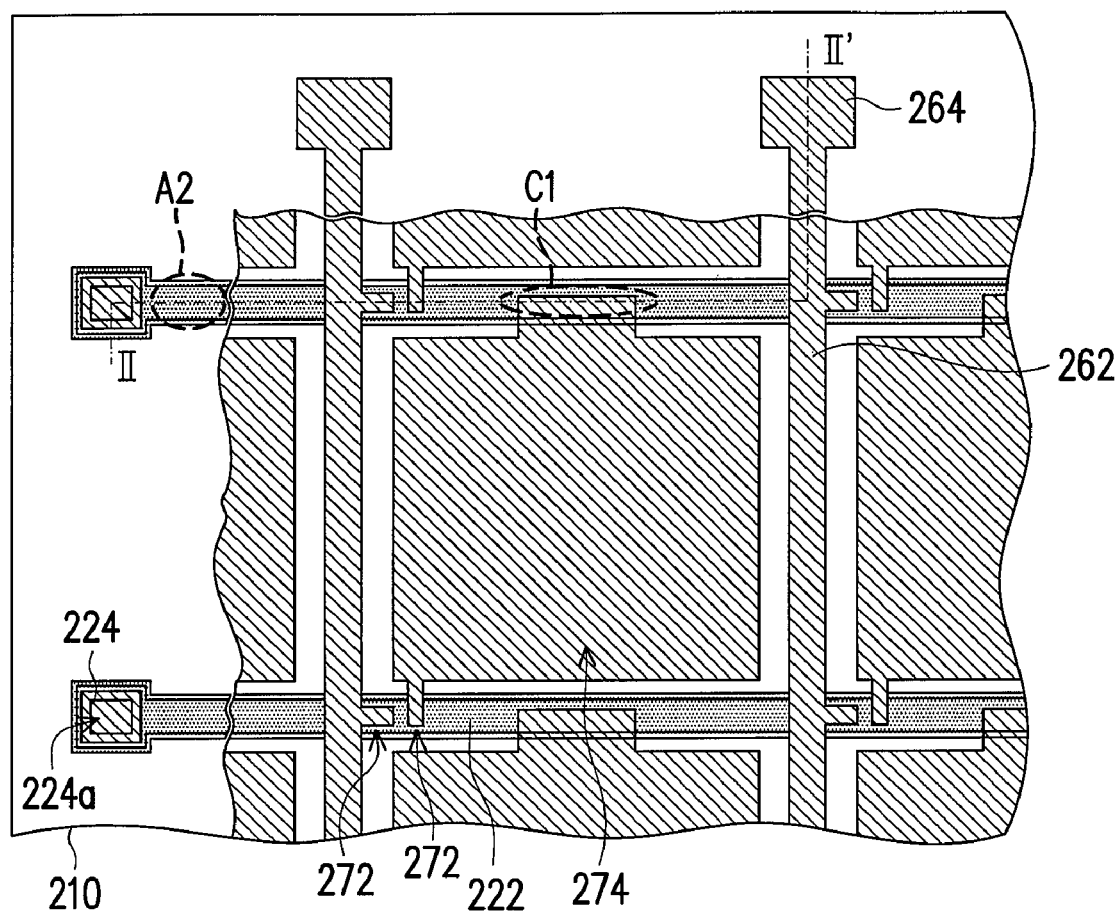
Figure 23B:
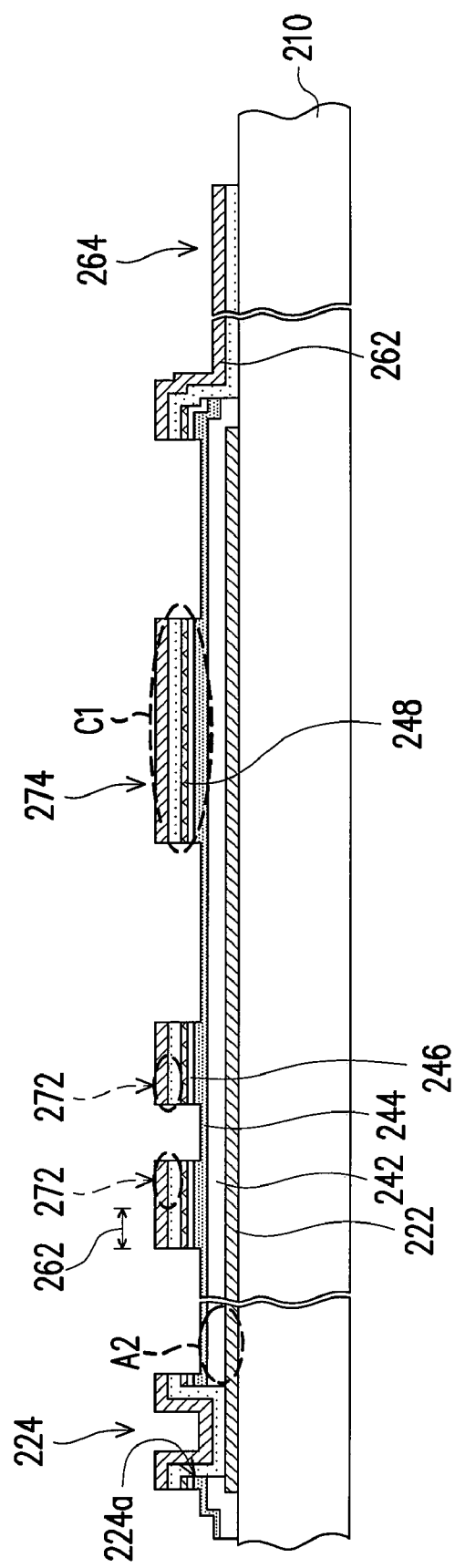

Please refer to FIGS. 23A and 23B. The third mask process in the fifth embodiment is also similar to that in the fourth embodiment, for forming a patterned transparent conductive layer 252 and a patterned second metal layer 254. The patterned transparent conductive layer 252 and the patterned second metal layer 254 define data lines 262, data pads 264, source/drain electrodes 272 and pixel electrodes 274. Similar to the fourth embodiment, the pixel electrodes 274 in the fifth embodiment covers portions of the scan lines 222 (as shown in the region C1) and the pixel electrodes 274 are stacked over the multilayer over the scan lines 222 (for example, the patterned dielectric layer 242, the patterned semiconductor layer 244, the patterned ohmic contact layer 246 and the patterned contact metal layer 248). Besides, because the pixel electrodes 274 cover portions of the scan lines 222, the region C1 is defined as the storage capacitor on the gate.

Furthermore, the patterned contact metal layer 248, the patterned ohmic contact layer 246, and portions of the patterned semiconductor layer 244 in other regions (for example, in a channel region, the region A1, and the region B1) exposed by the patterned transparent conductive layer 252 and the patterned metal layer 254 are further removed. Thereby, the portions of the patterned semiconductor layer 244 in the regions are exposed.

Figure 24B:
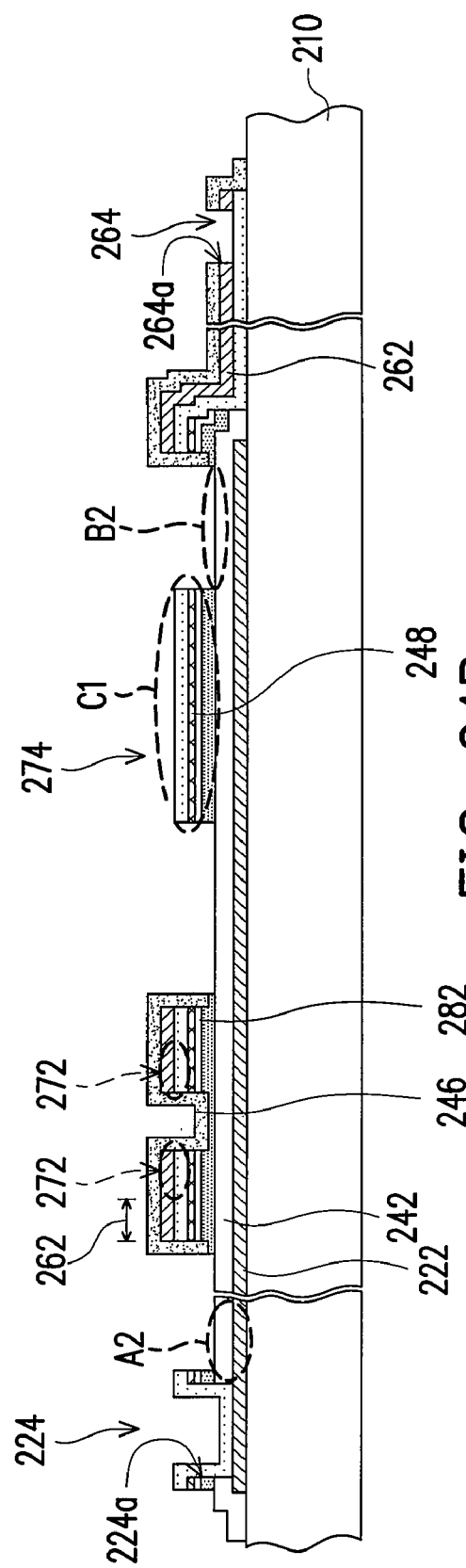
Figure 24A:
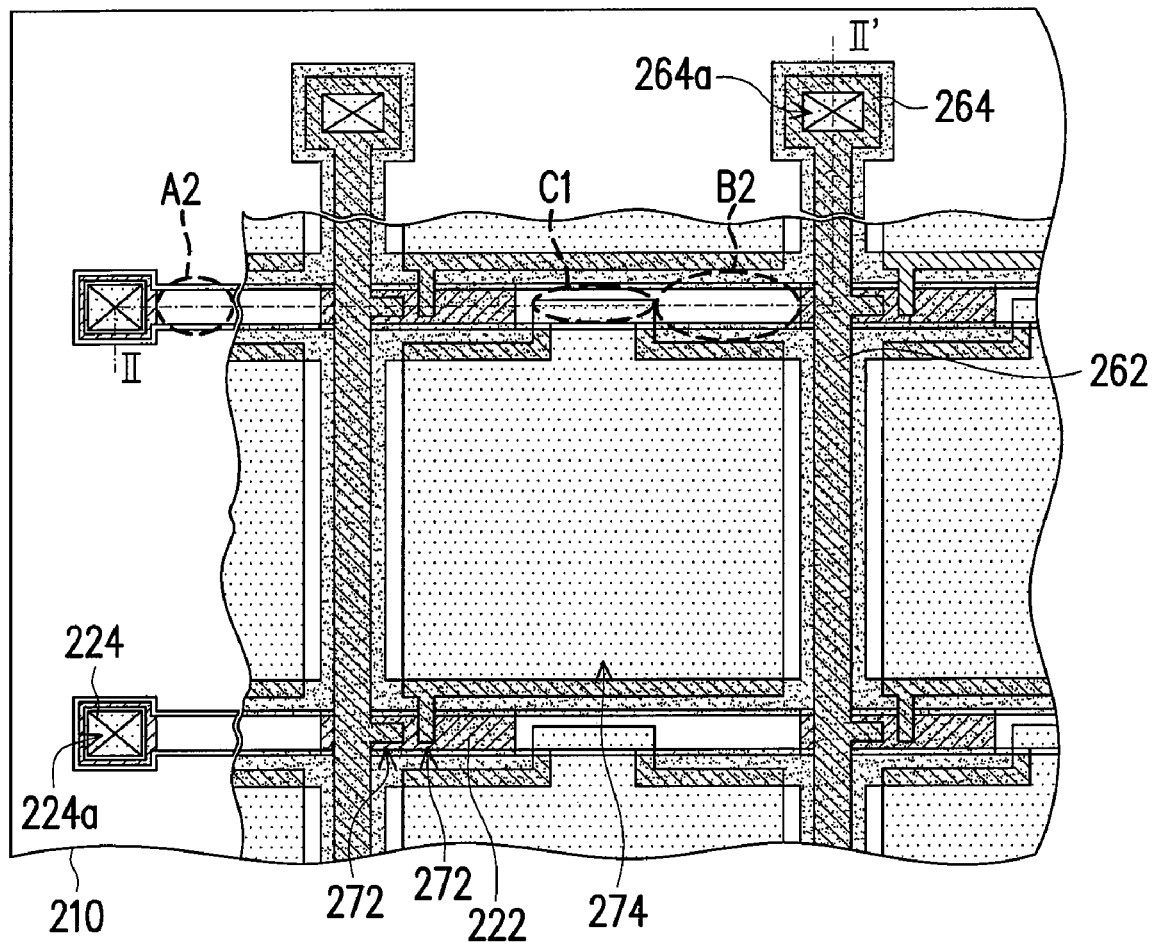

Please refer to FIGS. 24A and 24B, a passivation layer 282 is formed over the substrate 210. The passivation layer 282 is made of SiNx. The fourth mask process in the fifth embodiment is also similar to that in the fourth embodiment, for removing the passivation layer 282 and the patterned second metal layer 254 in some regions to expose the patterned transparent conductive layer 252 of the pixel electrodes 274. The patterned semiconductor layer 244 over portions of the scan lines 222 is also removed for exposing the patterned dielectric layer 242, as shown in the regions A2 and B2. The TFT array substrate according to the fifth embodiment is almost completed.

Sixth Embodiment

The present embodiment is similar to the first embodiment. The difference therebetween relies on that an opaque layer is formed over the passivation layer in the present embodiment. Thereby, the TFT array substrate provided by the present embodiment can be used with the color filter substrate having no opaque layer, so as to improve the aperture ratio. In addition, the TFT array substrate made by the fabrication method according to the sixth embodiment is suitable for the Twisted Nematic Liquid Crystal Display (TN-LCD) display. The storage capacitor is on the common lines and the sixth embodiment is not limited to this. For example, the storage capacitor may be on the gates. In the sixth embodiment, the gates of the TFTs are on the scan lines. However, types or configuration of the TFTs are not limited in the sixth embodiment. For example, the gates and the scan lines are concurrently formed and electrically connected to each other.

FIGS. 25A~28A are top views illustrating the TFT array substrate according to the sixth embodiment of the invention. FIGS. 25B~28B illustrate cross-sectional views taken along the line II-II' in FIGS. 25A~28A. FIGS. 25C~28C illustrate cross-sectional views taken along the line III-III' in FIGS. 25A~28A.

Figure 25A:
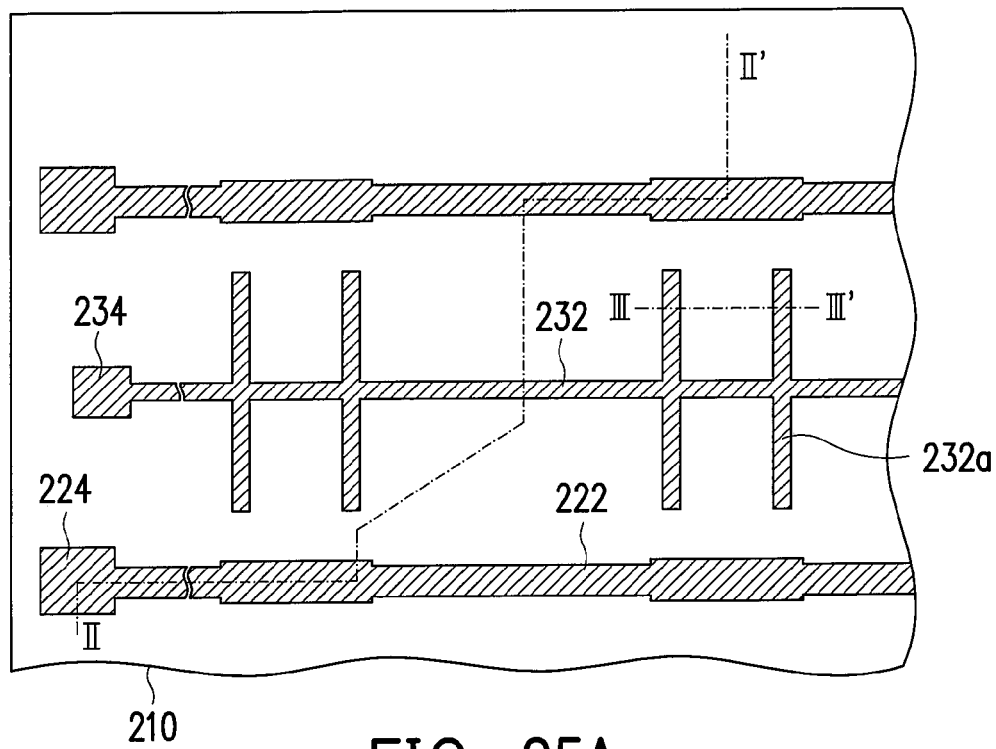

Please refer to FIGS. 25A, 25B and 25C. A substrate 210 is provided. The substrate 210 is, for example, a glass substrate, a quartz substrate, or substrates made of other transparent materials.

A first metal layer with thickness of several thousand angstroms is formed on the substrate 210 by sputtering. The first metal may be a single layer of aluminum (Al), titanium (Ti), molybdenum (Mo), chromium (Cr), copper (Cu), Al alloy, Cu alloy or nitrides thereof. Alternatively, the first metal layer may be a multi-layer made including combinations of the foregoing single layer. A first mask process is performed on the first metal layer for forming scan lines 222, scan pads 224, common lines 232, and common pads 234. One end of each of the scan lines 222 is electrically connected to one of the scan pads 224 and one end of each of the common lines 232 is electrically connected to one of the common pads 234. The common lines 232 and the scan lines 222 are parallel and alternately displaced over the substrate 210. Each of the common lines 232 has branches 232a extending outwards at edges. The branches 232a of the scan lines 232 are used as shield layers of the TFT array substrate for improving the aperture ratio. The branch 232a is optional to the common line 232 and other types of the common line 232 are applicable in the sixth embodiment.

Figure 26A:
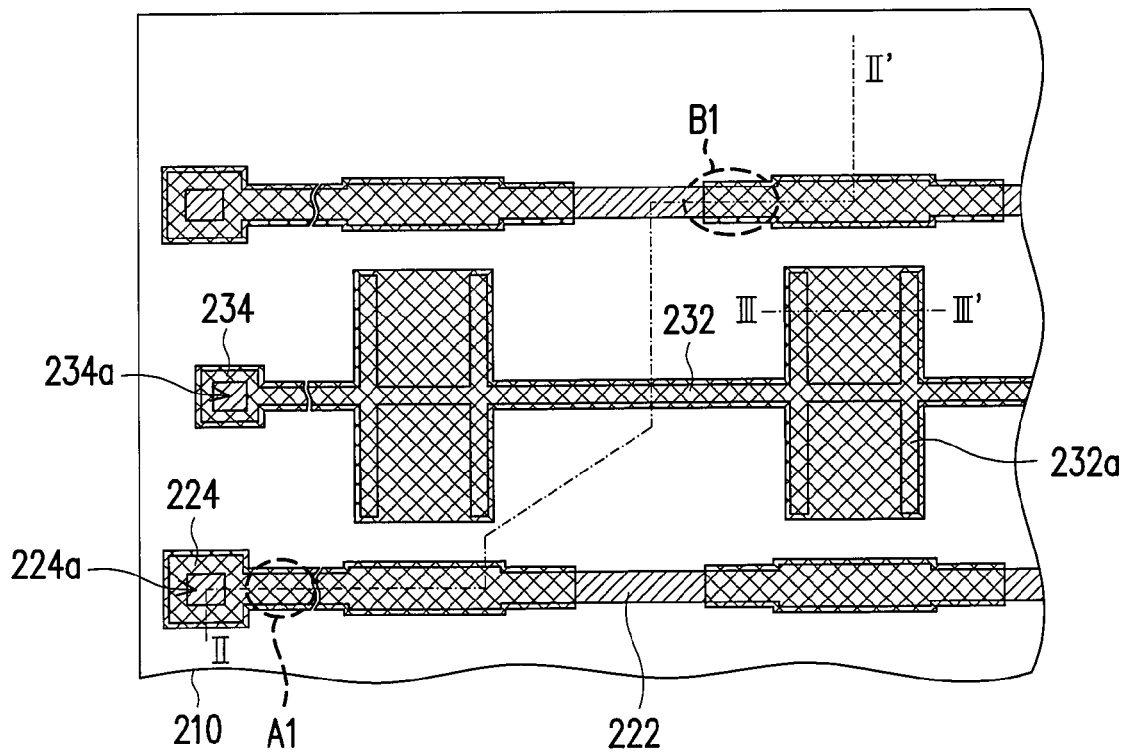

Please refer to FIGS. 26A, 26B and 26C. A dielectric layer and a semiconductor layer are sequentially formed over the substrate 210 by a chemical vapor deposition (CVD) process. The dielectric layer and the semiconductor layer are made of SiNx and a-Si, respectively. For increasing ohmic contact between the semiconductor layer and other layers (for example, the pixel electrodes), an ohmic contact layer and a contact metal layer are sequentially formed over the semiconductor layer. Alternatively, only an ohmic contact layer is formed over the semiconductor layer. In this embodiment, the ohmic contact layer and the contact metal layer are optional. The ohmic contact layer is made of $n^+$-Si. The ohmic contact layer is formed by CVD. The contact metal layer is formed by sputtering and includes a single layer made of aluminum (Al), titanium (Ti), molybdenum (Mo), chromium (Cr), Al alloy, Cu alloy or a multi-layer including combinations of the foregoing single layer.

A second mask process is performed on the resulting structure for sequentially forming a patterned dielectric layer 242, a patterned semiconductor layer 244, a patterned ohmic contact layer 246, and a patterned contact metal layer 248. These layers cover the common lines 232 and portions of the scan lines 222 (for example, those in the regions A1 and B1, some wiring inside the region A1). These layers 242~248 have multiple first openings 224a and multiple third openings 234a for exposing portions of the scan pads 224 and portions of the common pads 234. The patterned dielectric layer 242, the patterned semiconductor layer 244, the patterned ohmic contact layer 246, and the patterned contact metal layer 248 within other regions should be totally removed for exposing portions of the scan lines 222 (for example, the scan lines 122 between the regions B1). For reducing damages to the scan lines 222, an etching process with high selectivity for the scan lines 222 is applied.

In this embodiment, the patterned dielectric layer 242, the patterned semiconductor layer 244, the patterned ohmic contact layer 246, and the patterned contact metal layer 248 cover the portions of the scan pads 224 and the portions of the common pads 234. Alternatively, the layers 242~248 may entirely expose the scan pads 224 and the common pads 234.

Figure 27A:
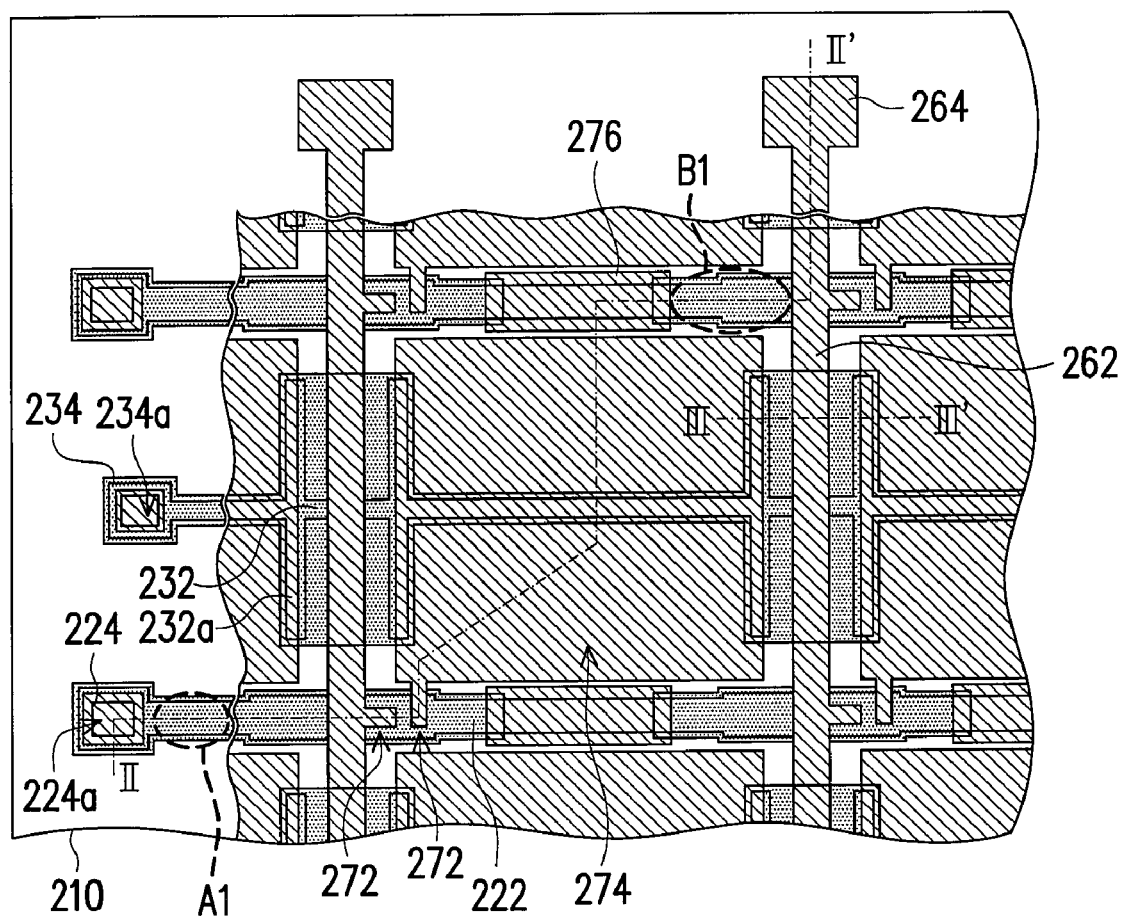
Figure 27C:
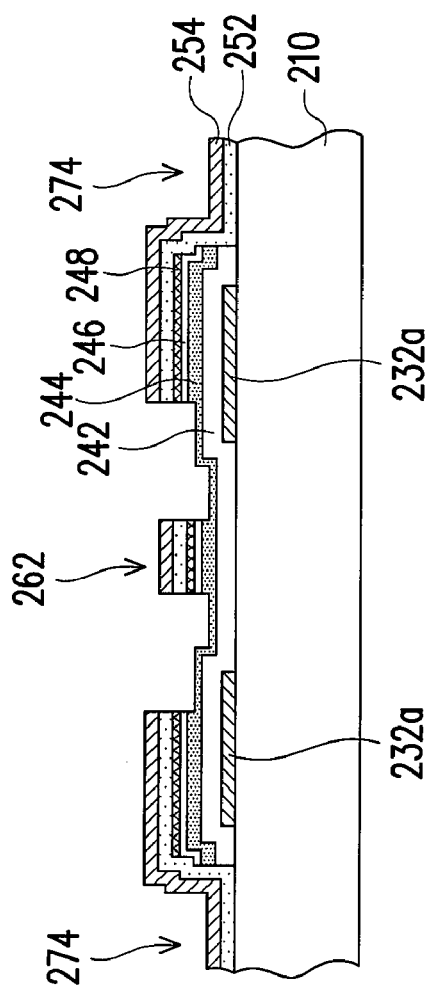

Please refer to FIGS. 27A, 27B, and 27C. A transparent conductive layer and a second metal layer are sequentially formed over the substrate 210. A third mask process is performed for removing the transparent conductive layer, the second metal layer, the patterned ohmic contact layer 246, and the patterned contact metal layer 248 in some regions to form a patterned transparent conductive layer 252 and a patterned metal layer 254. The patterned transparent conductive layer 252 is made of, for example but not limited to, indium tin oxide (ITO), indium zinc oxide (IZO), Zinc oxide doped with aluminum (ZAO), indium tin zinc oxide (ITZO) or other transparent metal oxides. The patterned metal layer 254 includes a single layer made of aluminum (Al), titanium (Ti), molybdenum (Mo), chromium (Cr), copper (Cu), Al alloy, Cu alloy or a multi-layer including combinations of the foregoing single layer.

In more details, the patterned transparent conductive layer 252 and the patterned second metal layer 254 are used to define data lines 262, data pads 264, source/drain electrodes 272, pixel electrodes 274, and etching protective layers 276. One end of each of the data lines 262 is electrically connected to one of the data pads 264. The etching protective layers 276 cover and are electrically connected to the scan lines 222 exposed by the patterned dielectric layers 242 and the patterned semiconductor layers 244. The pixel electrodes 274 overlap with portions of the branches 232a of the common lines 232. In this embodiment, the patterned transparent conductive layer 252 and the patterned metal layer 254 cover the scan pads 224 exposed by the patterned dielectric layer 242, the patterned semiconductor layer 244, the patterned ohmic contact layer 246, and the patterned contact metal layer 248. Alternatively, the patterned transparent conductive layer 252 and the patterned metal layer 254 may not cover the scan pads 224.

Because the etching protective layers 276, including the patterned transparent conductive layer 252 and the patterned metal layer 254, cover the scan lines 222 uncovered by the patterned dielectric layer 242 and the patterned semiconductor layer 244, the etching protective layers 276 protect the scan lines 222 in the following etching processes. Because the patterned transparent conductive layer 252 and the patterned metal layer 254 are both conductive and the etching protective layers 276 contact with the scan lines 222, the etching protective layers 276 are parallel electrically connected to the scan lines 222. Namely, due to the parallel electrically connecting between the etching protective layers 276 and the scan lines 222, the resistance of the scan lines 222 is reduced for reducing the RC delay.

Furthermore, the patterned contact metal layer 248, the patterned ohmic contact layer 246, and portions of the patterned semiconductor layer 244 in other regions (for example, in a channel region, the region A1, and the region B1) exposed by the patterned transparent conductive layer 252 and the patterned metal layer 254 are further removed. Thereby, the portions of the patterned semiconductor layer 244 in the regions are exposed.

Figure 28C:
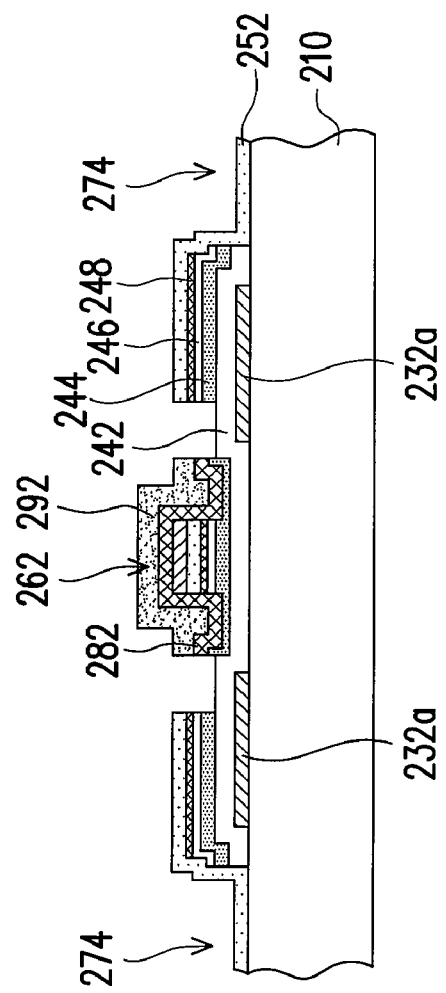
Figure 28A:
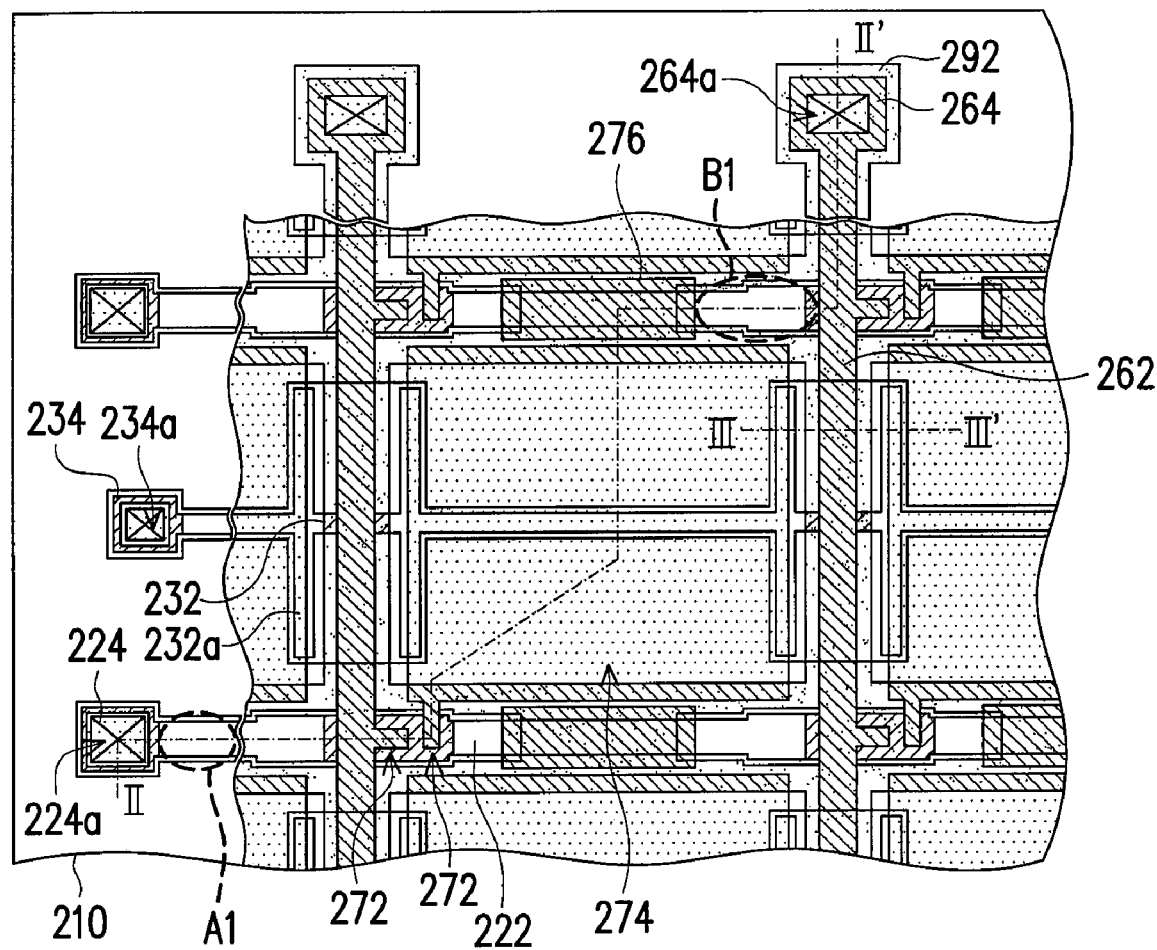

Please refer to FIGS. 28A, 28B, and 28C. A passivation layer 282 is formed over the substrate 210. The passivation layer 282 is made of SiNx, for example. An opaque layer 292 is formed over the passivation layer 282. More specifically, an opaque material layer (not shown) is formed over the passivation layer 282. In the present embodiment, the opaque material layer is black resin, while the opaque material layer may be metal in another embodiment.

An exposure process and a development process are then performed on the opaque material layer for forming the opaque layer 292. The opaque layer 292A is used as a mask for removing the passivation layer 282 and the patterned metal layer 254 disposed over the pixel electrodes 274, so as to expose the patterned transparent conductive layer 252 of the pixel electrodes 274. The patterned semiconductor layer 244 over the scan lines 222 between the etching protective layers 276 and the data lines 262 is removed for exposing the patterned dielectric layer 242 over the scan lines 222 (in regions A1 and B1). Therefore, each of the data lines 262 is electrically insulated from each other. Here, the TFT array substrate according to the sixth embodiment is almost completed.

In the sixth embodiment, second openings 264a are formed in the passivation layer 282 and the patterned metal layer 254 for exposing portions of the data pads 264. The passivation layer 282 and the patterned metal layer 254 over the scan pads 224 and the common pads 234 are totally removed for exposing the patterned transparent conductive layer 252.

In the sixth embodiment, the patterning process is performed on the opaque material layer, the passivation layer, and the patterned metal layer to expose the patterned transparent conductive layer of the pixel electrodes and to form the opaque layer which is not removed in the following processes. Therefore, the TFT array substrate provided by the present embodiment can be used with the color filter substrate having no opaque layer, so that the aperture ratio is improved. In other words, given that the TFT array substrate and the color filter substrate provided by the present embodiment are adopted, the fabrication process of the opaque layer can be omitted, reducing the number of photomasks.

The TFT array substrate made by the fabrication method according to the sixth embodiment is suitable for the Twisted Nematic Liquid Crystal Display (TN-LCD) display. Given that a plurality of slits is formed in the pixel electrodes during the process of forming the patterned transparent conductive layer and the patterned metal layer, the TFT array substrate can be applied to the Vertically Alignment Liquid Crystal Display (VA-LCD) as well. Moreover, the sixth embodiment is illustrated by means of the structure in the first embodiment, while the opaque layer can also be formed in the same way as are provided by other embodiments.

As discussed above, the fabrication method according to the invention at least has the following advantages.

In the invention, the semiconductor, the ohmic contact layer, the transparent conductive layer and the metal layer forming the data lines are used for protecting the exposed scan lines. When the transparent conductive layer and the metal layer forming the data lines are used for protecting the exposed scan lines, the etching protective layers including the metal layer forming the data lines is parallel electrically connected to the scan lines. Therefore, the damage to the scan lines is reduced and the resistance value of the scan lines is lowered due to the etching protective layers, for reducing the RC delay effect.

The common lines with the branches are applicable in the invention as the shield layer for the sides of the TFT array substrate for increasing the aperture ratio.

The fabrication process in the invention is compatible to the conventional process. So, no additional or dedicated device for the invention is required.

The present invention provides an opaque layer formed over the passivation layer. Therefore, the TFT array substrate provided by the present invention can be used with the color filter substrate having no opaque layer, so as to improve the aperture ratio.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A fabrication method for a thin film transistor (TFT) array substrate, the method comprising:

forming a plurality of scan lines on a substrate;

sequentially forming a patterned dielectric layer and a patterned semiconductor layer over the substrate for covering portions of the scan lines;

sequentially forming a patterned transparent conductive layer and a patterned metal layer over the substrate, the patterned transparent conductive layer and the patterned metal layer used for defining a plurality of data lines, a plurality of source/drain electrodes, a plurality of pixel electrodes and a plurality of etching protective layers, the etching protective layers covering and being parallel electrically connected to the scan lines exposed by the patterned dielectric layer and the patterned semiconductive layer;

forming a passivation layer over the substrate; and removing the passivation layer over the pixel electrodes and the patterned metal layer of the pixel electrodes for exposing the patterned transparent conductive layer of the pixel electrodes, and removing the patterned semiconductive layer over the scan lines between the etching protective layers and the data lines for exposing the patterned dielectric layer over the scan lines.

2. The fabrication method of claim 1, wherein the step of forming the scan lines comprises:

forming a plurality of scan pads, one end of each of the scan lines electrically connected to one of the scan pads; and a portion of the scan pads are exposed by the patterned dielectric layer and the patterned semiconductor layer after formation of the patterned dielectric layer and the patterned semiconductor layer.

3. The fabrication method of claim 2, wherein the patterned transparent conductive layer and the patterned metal layer cover the scan pads exposed by the patterned dielectric layer and the patterned semiconductor layer.

4. The fabrication method of claim 3, wherein the step of removing the passivation layer over the pixel electrodes and the patterned metal layer of the pixel electrodes includes removing the patterned metal layer over the scan pads for exposing the patterned transparent conductive layer over the scan pads.

5. The fabrication method of claim 1, wherein the patterned transparent conductive layer and the patterned metal layer are used to further define a plurality of data pads, one end of each of the data lines electrically connected to one of the data pads.

6. The fabrication method of claim 5, wherein the passivation layer covers the data pads; and
the step of removing the passivation layer over the pixel electrodes and the patterned metal layer of the pixel electrodes comprises removing the patterned metal layer over the data pads for exposing the patterned transparent conductive layer over the data pads.

7. The fabrication method of claim 1, wherein the step of forming the scan lines comprises:
forming a plurality of common pads and a plurality of common lines respectively electrically connected to the common pads, the common lines being parallel to the scan lines, and the common lines and the scan lines being alternately disposed over the substrate.

8. The fabrication method of claim 7, wherein each of the common lines has a plurality of branches extending from the sides thereof, and the patterned transparent conductive layer of the pixel electrodes are partially overlapped with the branches.

9. The fabrication method of claim 1, wherein the step of forming the patterned transparent conductive layer and the patterned metal layer comprises forming a plurality of slits insides the pixel electrodes.

10. The fabrication method of claim 1, wherein the step of forming the patterned dielectric layer and the patterned semiconductive layer comprises forming a patterned ohmic contact layer over the patterned semiconductive layer.

11. The fabrication method of claim 10, wherein the step of forming the patterned dielectric layer and the patterned semiconductive layer further comprises forming a patterned contact metal layer over the patterned ohmic contact layer.

12. The fabrication method of claim 1, wherein each of the scan lines has a plurality of gate regions.

13. The fabrication method of claim 1, wherein the step of forming the scan lines comprises forming a plurality of gates respectively electrically connected to the scan lines.

14. The method of claim 1, further comprising the following steps after the step of forming the passivation layer and before the step of removing the same:
forming an opaque material layer over the passivation layer; and
patterning the opaque material layer for forming an opaque layer.

15. A fabrication method for a thin film transistor (TFT) array substrate, the method comprising:
forming a plurality of scan lines on a substrate;
sequentially forming a patterned dielectric layer and a patterned semiconductor layer over the substrate for covering the scan lines;
sequentially forming a patterned transparent conductive layer and a patterned metal layer over the substrate, the patterned transparent conductive layer and the patterned metal layer used for defining a plurality of data lines, a plurality of source/drain electrodes and a plurality of pixel electrodes, a portion of the patterned semiconductor layer over the scan lines being exposed by the patterned transparent conductive layer and the patterned metal layer;
forming a passivation layer over the substrate; and
removing the passivation layer over the pixel electrodes and the patterned metal layer of the pixel electrodes for exposing the patterned transparent conductive layer of the pixel electrodes, and removing the portion of the patterned semiconductor layer over the scan lines exposed by the patterned transparent conductive layer and the patterned metal layer for exposing the patterned dielectric layer over the scan lines.

16. The fabrication method of claim 15, wherein the step of forming the scan lines comprises:
forming a plurality of scan pads, one end of each of the scan lines electrically connected to one of the scan pads; and
portions of the scan pads are exposed by the patterned dielectric layer and the patterned semiconductive layer after formation of the patterned dielectric layer and the patterned semiconductive layer.

17. The fabrication method of claim 16, wherein the patterned transparent conductive layer and the patterned metal layer cover the scan pads exposed by the patterned dielectric layer and the patterned semiconductor layer.

18. The fabrication method of claim 16, wherein the step of removing the passivation layer over the pixel electrodes and the patterned metal layer of the pixel electrodes comprises removing the patterned metal layer over the scan pads for exposing the patterned transparent conductive layer over the scan pads.

19. The fabrication method of claim 15, wherein the patterned transparent conductive layer and the patterned metal layer are used to further define a plurality of data pads, one end of each of the data lines electrically connected to one of the data pads.

20. The fabrication method of claim 19, wherein the passivation layer covers the data pads; and
the step of removing the passivation layer over the pixel electrodes and the patterned metal layer of the pixel electrodes comprises removing the patterned metal layer over the data pads for exposing the patterned transparent conductive layer over the data pads.

21. The fabrication method of claim 15, wherein the step of forming the scan lines comprises:
forming a plurality of common pads and a plurality of common lines electrically connected to the common pads respectively, the common lines being parallel to the scan lines, and the common lines and the scan lines being alternately disposed over the substrate.

22. The fabrication method of claim 21, wherein each of the common lines has a plurality of branches extending from the sides thereof, and the patterned transparent conductive layer of the pixel electrodes are partially overlapped with the branches.

23. The fabrication method of claim 15, wherein the pixel electrodes cover portions of the scan lines.

24. The fabrication method of claim 15, wherein the step of forming the patterned dielectric layer and the patterned semiconductive layer comprises forming a patterned ohmic contact layer over the patterned semiconductive layer.

25. The fabrication method of claim 24, wherein the step of forming the patterned dielectric layer and the patterned semiconductive layer further comprises forming a patterned contact metal layer over the patterned ohmic contact layer.

26. The fabrication method of claim 15, wherein each of the scan lines has a plurality of gate regions.

27. The fabrication method of claim 15, wherein the step of forming the scan lines comprises forming a plurality of gates respectively connected to the scan lines respectively.

28. The fabrication method of claim 15, further comprising the following steps after the step of forming the passivation layer and before the step of removing the same:
   forming an opaque material layer over the passivation layer; and
   patterning the opaque material layer for forming an opaque layer.

* * * * *